United States Patent
Bryce et al.

(10) Patent No.: US 9,263,664 B1
(45) Date of Patent: Feb. 16, 2016

(54) INTEGRATING A PIEZORESISTIVE ELEMENT IN A PIEZOELECTRONIC TRANSISTOR

(71) Applicant: International Business Machines Corporation, Armonk, NY (US)

(72) Inventors: Brian A. Bryce, Chevy Chase, MD (US); Josephine B. Chang, Mahopac, NY (US); Matthew W. Copel, Yorktown Heights, NY (US); Marcelo A. Kuroda, Auburn, AL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/529,886

(22) Filed: Oct. 31, 2014

(51) Int. Cl.
  H01L 29/84 (2006.01)
  H01L 41/314 (2013.01)
  H01L 41/08 (2006.01)
  H01L 41/083 (2006.01)

(52) U.S. Cl.
  CPC ............ H01L 41/314 (2013.01); H01L 41/083 (2013.01); H01L 41/0805 (2013.01)

(58) Field of Classification Search
  CPC .. H01L 41/314; H01L 41/0805; H01L 41/083
  See application file for complete search history.

(56) References Cited

U.S. PATENT DOCUMENTS

| | | | |
|---|---|---|---|
| 4,419,598 A | 12/1983 | Spitz et al. | |
| 7,709,317 B2 | 5/2010 | Yang et al. | |
| 7,848,135 B2 * | 12/2010 | Elmegreen | G11C 13/0004 29/25.35 |
| 7,999,440 B2 | 8/2011 | Miller et al. | |
| 8,003,427 B2 | 8/2011 | Faraone et al. | |
| 8,004,154 B2 | 8/2011 | Cueff et al. | |
| 8,159,854 B2 | 4/2012 | Elmegreen et al. | |
| 8,247,947 B2 | 8/2012 | Elmegreen et al. | |
| 8,405,279 B2 | 3/2013 | Elmegreen et al. | |
| 8,604,670 B2 | 12/2013 | Mahameed et al. | |
| 2013/0009668 A1 | 1/2013 | Elmegreen et al. | |
| 2013/0036827 A1 | 2/2013 | Besling | |
| 2014/0169078 A1 | 6/2014 | Elmegreen et al. | |

OTHER PUBLICATIONS

List of IBM Patents or Patent Applications Treated as Related; (Appendix P), Filed Jul. 9, 2015; 2 pages.
Brian A. Bryce et al., "Integrating a Piezoresistive Element in a Piezoelectronic Transistor" U.S. Appl. No. 14/747,194, filed Jun. 23, 2015.
Brian A. Bryce et al., "Piezoelectronic Transistor With Co-Planar Common and Gate Electrodes" U.S. Appl. No. 14/747,137, filed Jun. 23, 2015.
Brian A. Bryce et al., "Passivation and Alignment of Piezoelectronic Transistor Piezoresistor" U.S. Appl. No. 14/747,223, filed Jun. 23, 2015.

(Continued)

*Primary Examiner* — Shaun Campbell
(74) *Attorney, Agent, or Firm* — Cantor Colburn LLP; Vazken Alexanian

(57) ABSTRACT

A semiconductor device, a piezoelectronic transistor (PET) device, and a method of fabricating the PET device are described. The method includes forming a first stack of dielectric layers, forming a first metal layer over the first stack, forming a piezoelectric (PE) material on the first metal layer, and forming a second metal layer on the PE material. The method also includes forming a piezoresistive (PR) element on the second metal layer through a gap in a first membrane formed a distance d above the second metal layer.

12 Claims, 32 Drawing Sheets

(56) References Cited

OTHER PUBLICATIONS

Matthew W. Copel, et al., "Piezoelectronic Switch Device for RF Applications" U.S. Appl. No. 14/745,521, filed Jun. 22, 2015.
List of IBM Patents or Patent Applications Treated as Related; (Appendix P), Filed Feb. 18, 2015; 2 pages.
Bruce G. Elmegreen et al., "Piezoelectronic Device With Novel Force Amplification", U.S. Appl. No. 14/577,279, filed Dec. 19, 2014.
List of IBM Patents or Patent Applications Treated as Related; (Appendix P), Filed Nov. 5, 2014; 2 pages.
Newns et al, "High Response Piezoelectric and Piezoresistive Materials for Fast, Low Voltage Switching: Simulation and Theory of Transduction Physics at the Nonometer-Scale", Advanced Materials, vol. 24, 2012, pp. 3672-3677.
Newns et al., "A low-voltage high-speed electronic switch based on piezoelectric transduction", Journal of Applied Physics, vol. 111, No. 8, 2012, pp. 1-18.
List of IBM Patents or Patent Applications Treated as Related; (Appendix P), Filed Oct. 31, 2014; 2 pages.
Brian A. Bryce et al., "Piezoelectronic Transistor With Co-Planar Common and Gate Electrodes", U.S. Appl. No. 14/529,834, filed Oct. 31, 2014.
Brian A. Bryce et al., "Passivation and Alignment of Piezoelectronic Transistor Piezoresistor", U.S. Appl. No. 14/529,929, filed Oct. 31, 2014.
Bruce G. Elmegreenet al., "Non-Volatile, Piezoelectronic Memory Based on Piezoresistive Strain Produced by Piezoelectric Remanence", U.S. Appl. No. 14/222,813, filed Mar. 24, 2014.
Bruce G. Elmegreen et al., "Low Voltage Transistor and Logic Devices With Multiple, Stacked Piezoelectronic Layers", U.S. Appl. No. 14/468,822, filed Aug. 26, 2014.
Matthew W. Copel et al., "Piezoelectronic Switch Device for RF Applications", U.S. Appl. No. 14/529,380, filed Oct. 31, 2014.

* cited by examiner

US 9,263,664 B1

INTEGRATING A PIEZORESISTIVE ELEMENT IN A PIEZOELECTRONIC TRANSISTOR

STATEMENT OF FEDERAL SUPPORT

This invention was made with Government support under contract number N66001-11-C-4109 awarded by Defense Advanced Research Projects Agency (DARPA). The Government has certain rights in the invention.

BACKGROUND

The present invention relates to piezoelectronic transistors, and more specifically, to integrating a piezoresistive element in a piezoelectronic transistor.

A piezoelectronic transistor (PET) includes a piezoelectric element (PE) that may be displaced to modulate the resistance of a piezoresistive (PR) element. The materials used to create a PET pose challenges in formation of the PET. One such challenge is instability of the PR element in air. The PR element may be comprised of samarium selenide (SmSe), samarium monosulfide (SmS), samarium telluride (SmTe), or thulium telluride (TmTe), for example. Long term stability of the PR element, particularly for thin films, currently requires passivation. The passivation may be achieved through application of an atomic layer deposition (ALD) film (e.g., hafnium dioxide ($HfO_2$) film) to the surface of the PR element, for example.

SUMMARY

According to one embodiment of the present invention, a method of fabricating a piezoelectronic transistor (PET) device includes forming a first stack including dielectric layers; forming a first metal layer over the first stack; forming a piezoelectric (PE) material on the first metal layer; forming a second metal layer on the PE material; and forming a piezoresistive (PR) element on the second metal layer through a gap in a first membrane formed a distance d above the second metal layer.

According to another embodiment, a piezoelectronic transistor (PET) device includes a first stack including dielectric layers; a first metal layer formed over the first stack; a piezoelectric (PE) material formed over the first metal layer; a second metal layer on the PE material; and a layer comprising a piezoresistive (PR) element and a passivation layer disposed on the second metal layer, the passivation layer filling a gap in a membrane to hermetically seal the PET device.

According to yet another embodiment, a semiconductor device includes a piezoelectronic transistor (PET) device comprising a first stack including dielectric layers, a first metal layer formed over the first stack, a piezoelectric (PE) material formed over the first metal layer, a second metal layer on the PE material, and a layer comprising a piezoresistive (PR) element and a passivation layer disposed on the second metal layer, the passivation layer filling a gap in a membrane to hermetically seal the PET device; and a voltage source configured to apply a voltage between the first metal layer and the second metal layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, the formation of a PET device involves challenges including those related to the stability of the PR element. Currently, passivation of the PR element is used to achieve long term stability. However, the application of an ALD film after deposition of, for example, SmSe as the PR element results in significant changes to the material. As a result, passivation is not performed after patterning of the PR element. Instead, a sidewall based passivation may be possible. However, this requires a highly selective etch between the PR element and the metal layer below. Embodiments of the devices and methods detailed herein relate to deposition of the PR element through an evacuated suspended membrane. As a result, sidewall free passivation and local patterning without etching the PR element in the modulated region are achieved.

Figure 1:
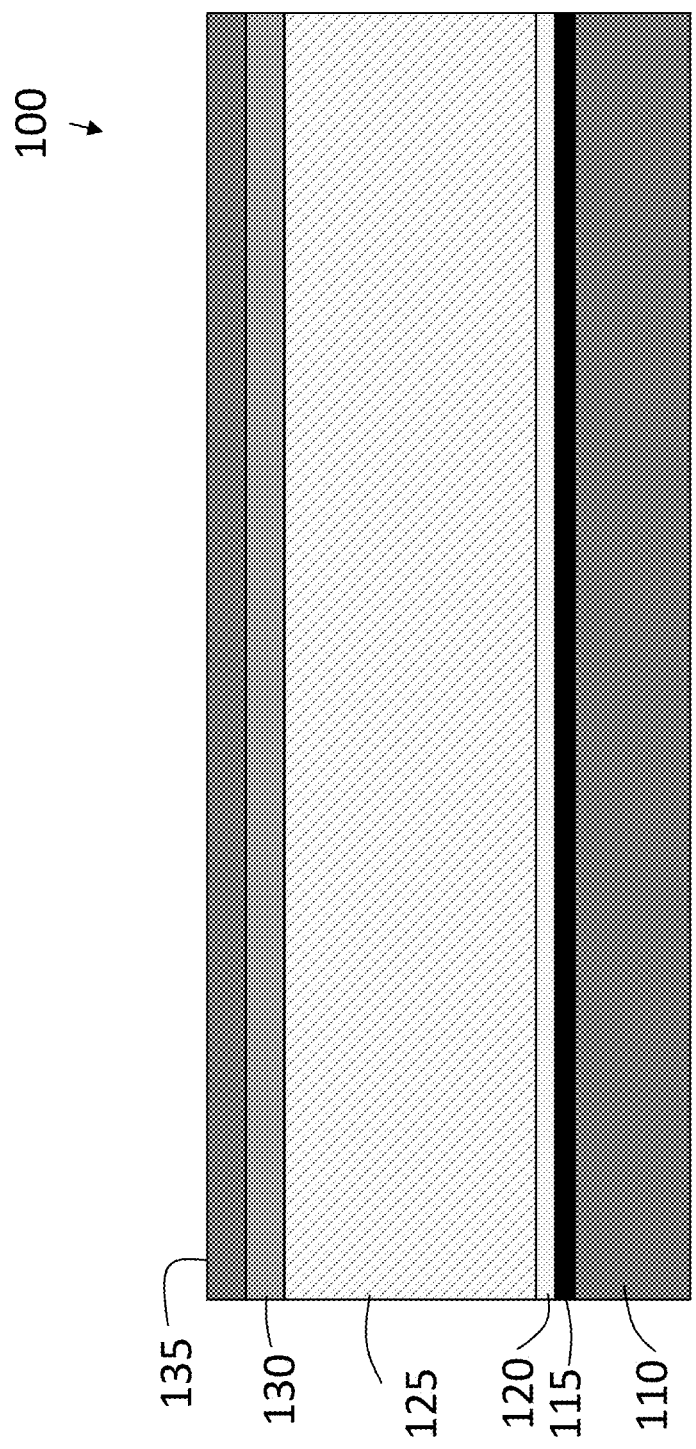
FIG. 1 illustrates a stage in the fabrication of a PET device according to an embodiment of the invention.
Figure 2:
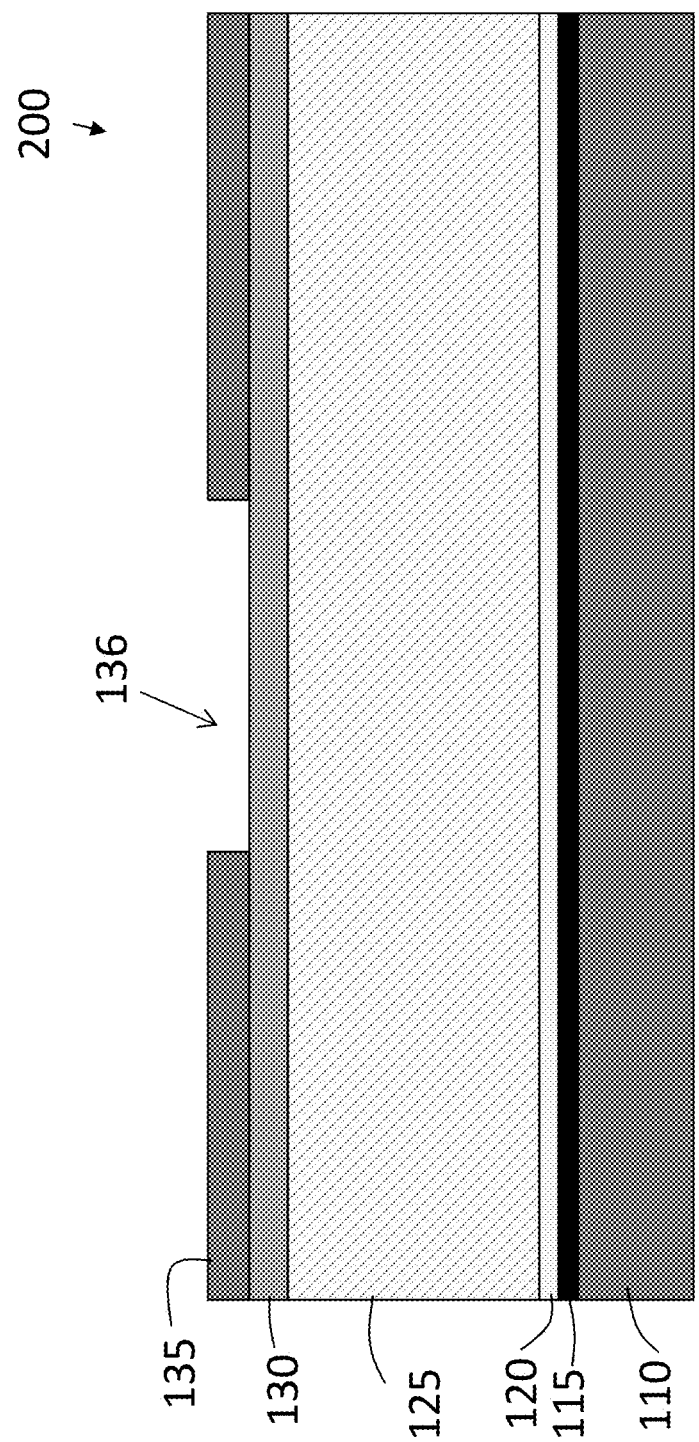
FIG. 2 illustrates another stage in the fabrication of a PET device according to an embodiment of the invention.

FIGS. 1-14 illustrate stages in the fabrication of a PET device 10 according to an embodiment of the invention. FIG. 1 illustrates a stage 100 in the fabrication of a PET device according to an embodiment of the invention. A silicon nitride (SiN) layer 135 is deposited on a stack. The stack (a dielectric stack or stack that includes dielectric layers) includes a base SiN layer 110, a hafnium dioxide ($HfO_2$) layer 115 above the SiN layer 110, and a metal M0 layer 120 above the $HfO_2$ layer 115. The PE material 125 is disposed on the M0 layer 120, and another metal M1 layer 130 is deposited on the PE material 125. The SiN layer 135 is deposited on the M1 layer 130 which may be polished to achieve local flatness. The polishing of the M1 layer 130 to achieve the required flatness may be necessary because of grain structure of the PE material 125. FIG. 2 illustrates another stage 200 in the fabrication of a PET device according to an embodiment of the invention. The SiN layer 135 deposited on the M1 layer 130 is patterned using lithography and reactive ion etching (RIE) to form an opening 136.

Figure 3:
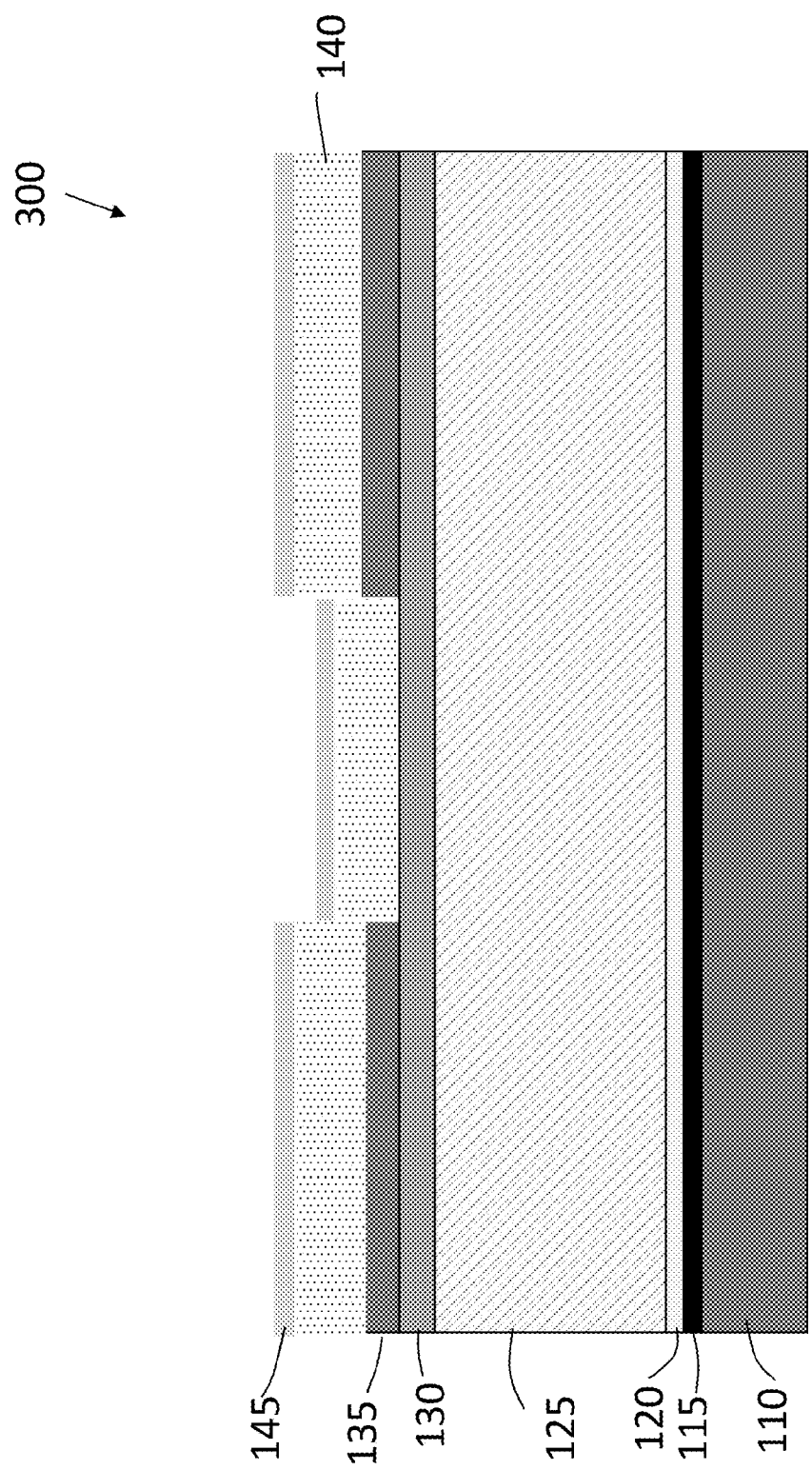
FIG. 3 illustrates another stage in the fabrication of a PET device according to an embodiment of the invention.
Figure 4:
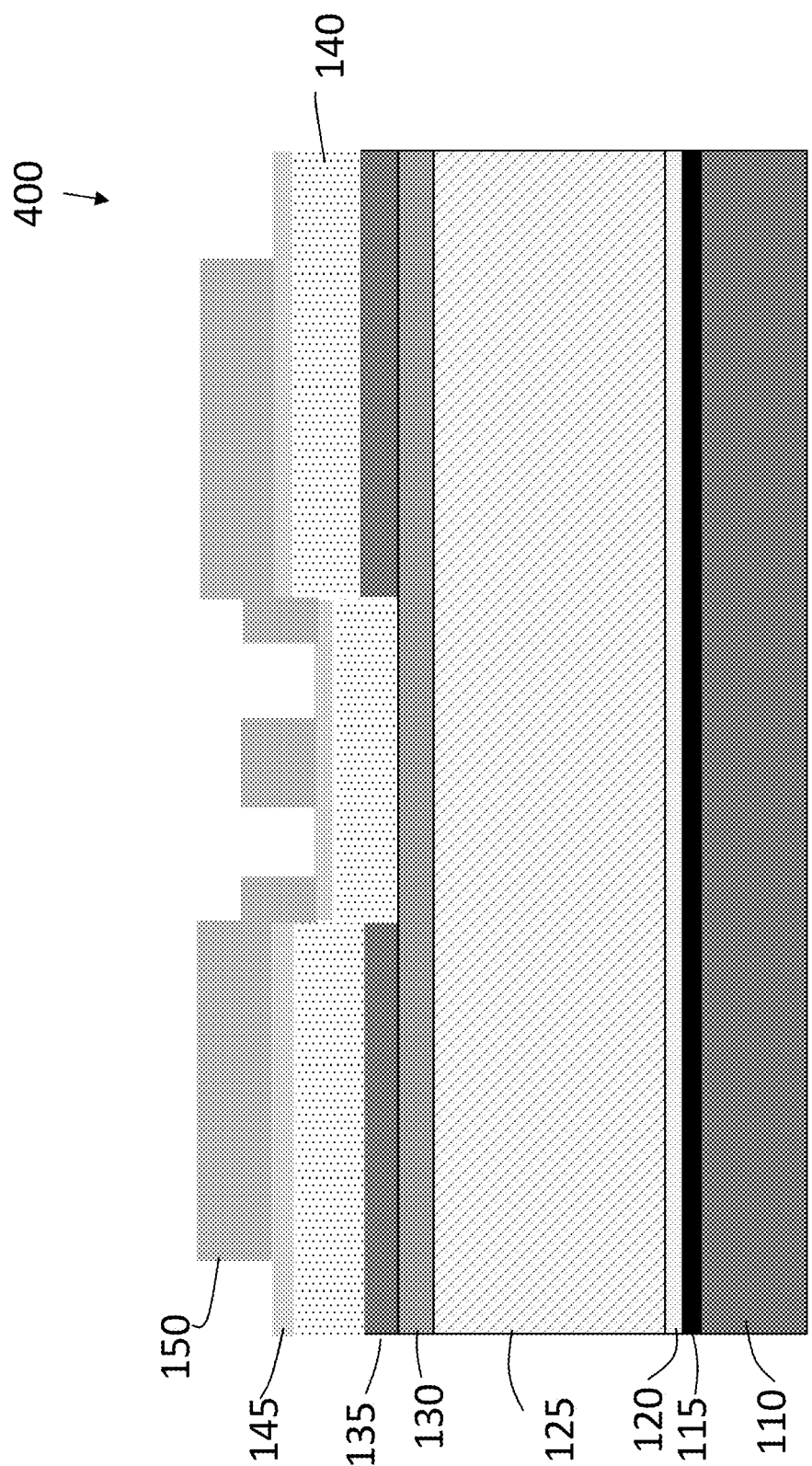
FIG. 4 illustrates another stage in the fabrication of a PET device according to an embodiment of the invention.
Figure 5:
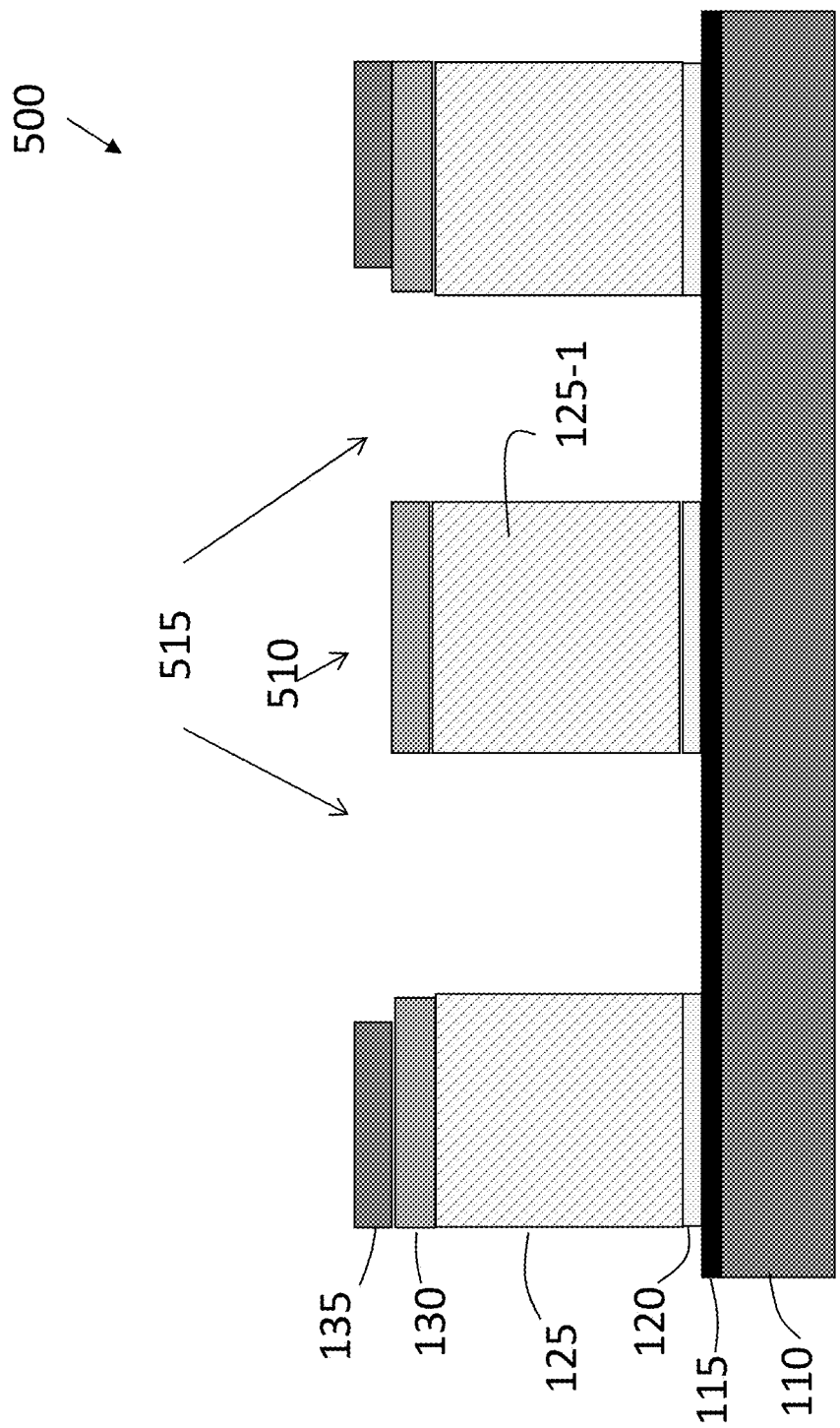
FIG. 5 illustrates another stage in the fabrication of a PET device according to an embodiment of the invention.
Figure 6:
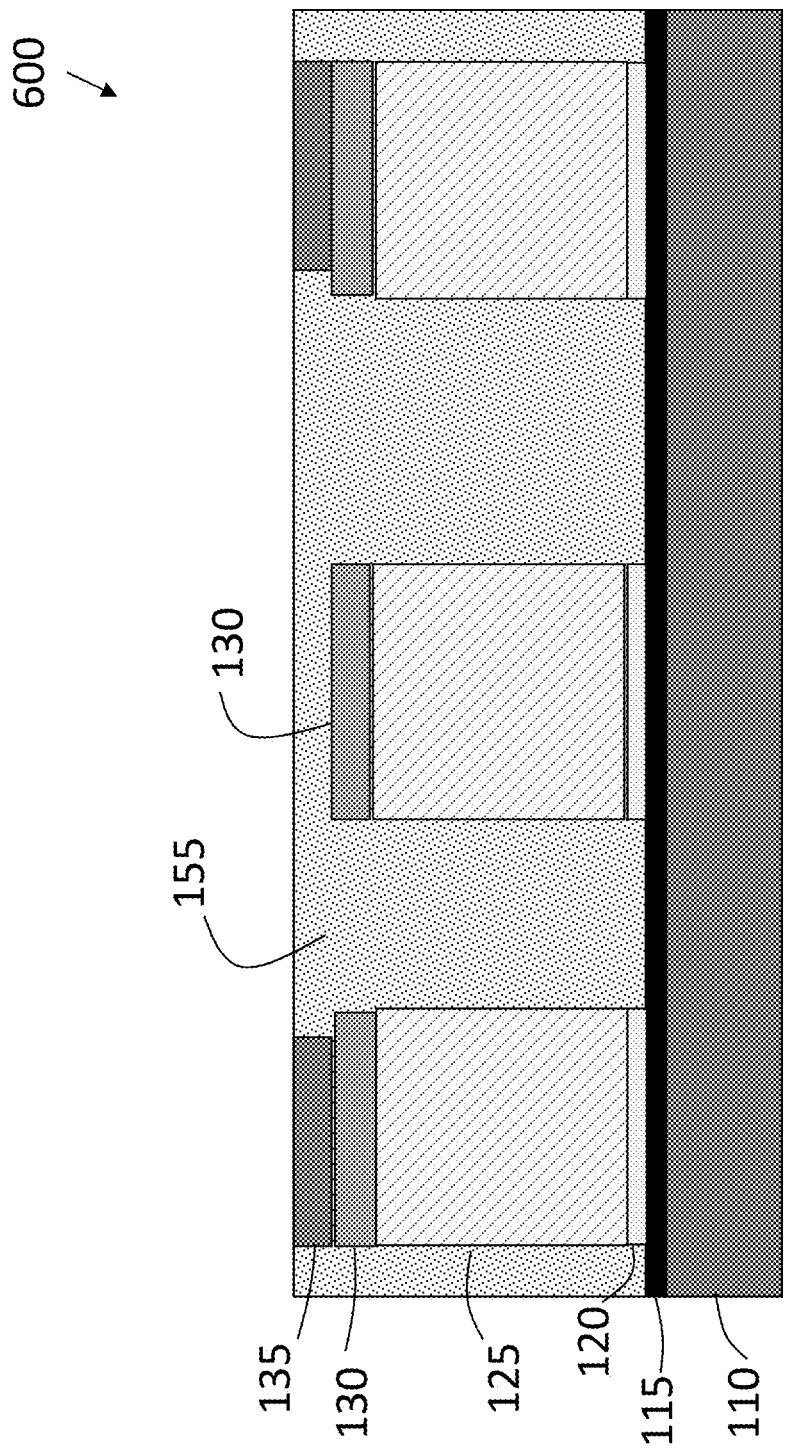
FIG. 6 illustrates another stage in the fabrication of a PET device according to an embodiment of the invention.
Figure 7:
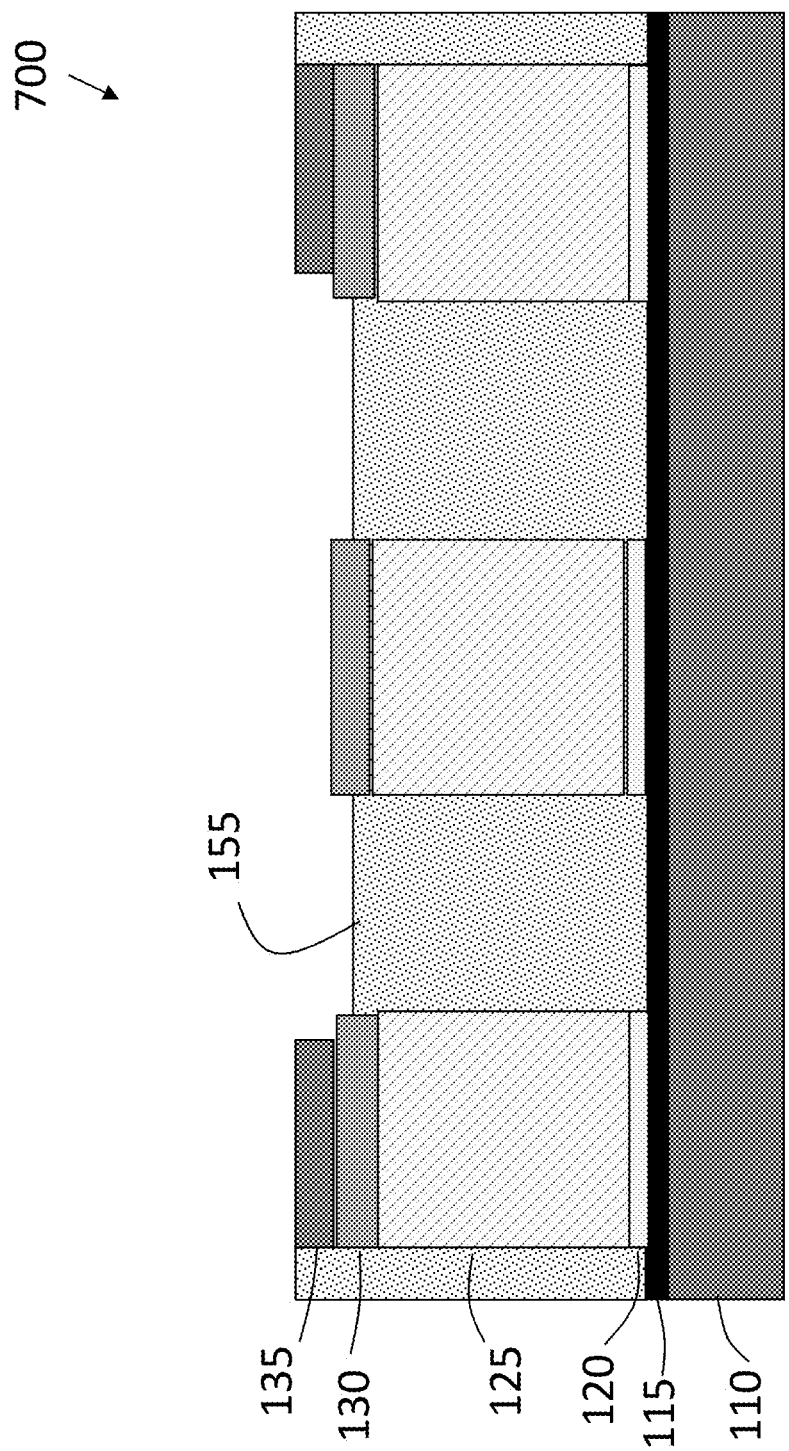
FIG. 7 illustrates another stage in the fabrication of a PET device according to an embodiment of the invention.

FIG. 3 illustrates another stage 300 in the fabrication of a PET device according to an embodiment of the invention. A tungsten (W) layer 140 and platinum (Pt) layer 145 are deposited as electroplating seed layers on the SiN layer 135 and exposed M1 layer 130. FIG. 4 illustrates another stage 400 in the fabrication of a PET device according to an embodiment of the invention. Nickel (Ni) 150 is electroplated through a lithographically defined resist mask on the Pt layer 145 and patterned. FIG. 5 illustrates another stage 500 in the fabrication of a PET device according to an embodiment of the invention. The PE material 125, M1 130, W 140 and Pt 145 are etched. After this the W layer 140, Pt layer 145, and Ni 150 are removed by a wet chemical etch. As FIG. 5 shows, the cross section of the device shown in stage 500 after patterning the PE material 125 includes a central pillar 510 and surrounding annulus 515. The patterning of the Ni layer 150 in FIG. 4 is such that the Ni layer 150 edges define the width of the three pillars (including central pillar 510) shown in FIG. 5. The W layer 140 under the Pt layer 145 facilitates a wet etch that does not destroy the PE material 125. Nickel (Ni) electroplating works well on the Pt layer 145 but benefits from the W layer 140 because the Pt layer 145 is hard to etch. The Ni 150 provides a material that does not etch quickly during the reactive ion etch needed to pattern the PE material 125. FIG. 6 illustrates another stage 600 in the fabrication of a PET device according to an embodiment of the invention. Silicon (Si) 155 is deposited and chemical mechanical polishing or planarization (CMP) is used to planarize the structure. FIG. 7 illustrates another stage 700 in the fabrication of a PET device according to an embodiment of the invention. The Si 155 is recessed via RIE in the central portion of the structure in stage 600. The mask for etching the recess in the RIE step is a lithographic photoresist.

Figure 8:
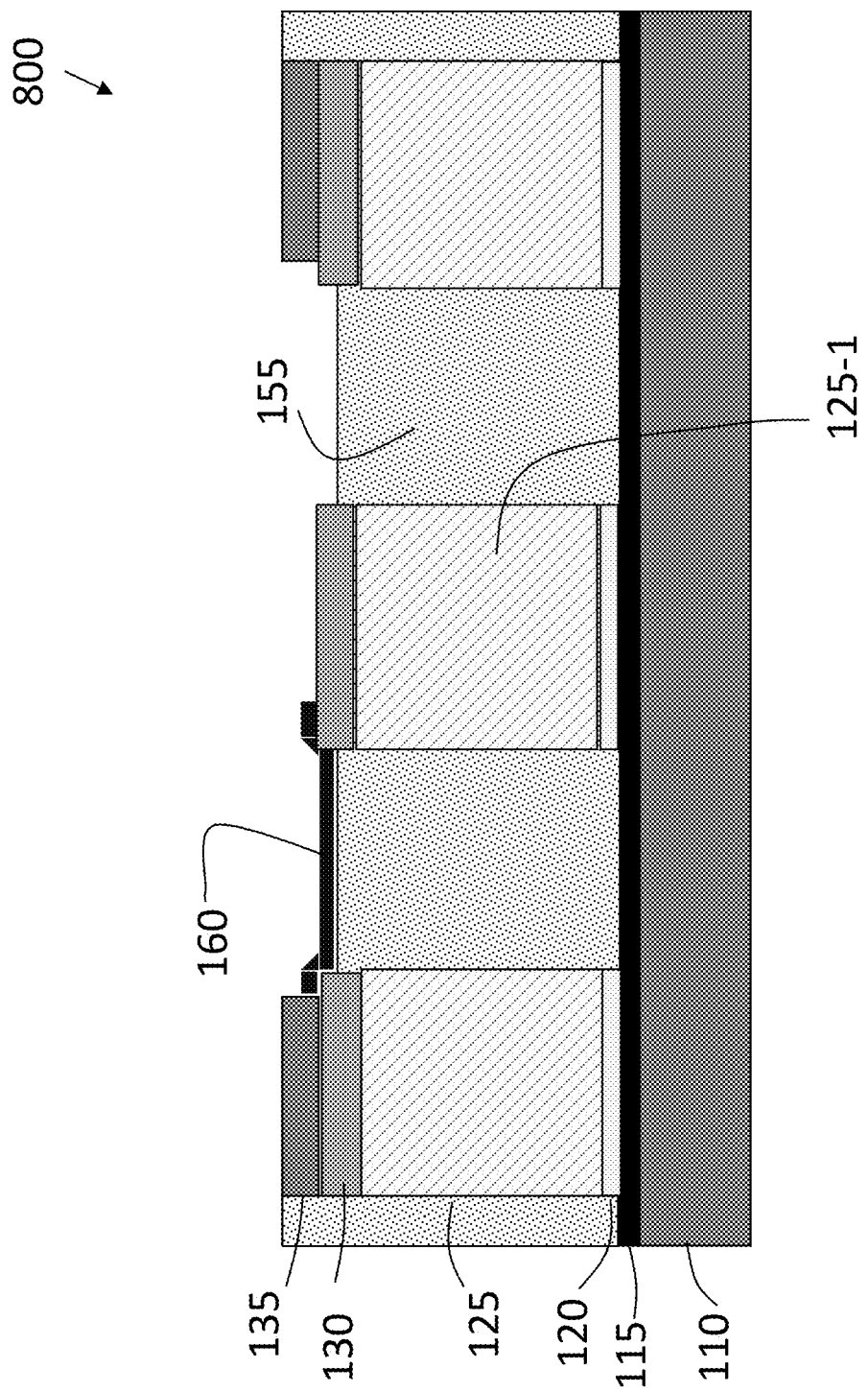
FIG. 8 illustrates another stage in the fabrication of a PET device according to an embodiment of the invention.
Figure 9:
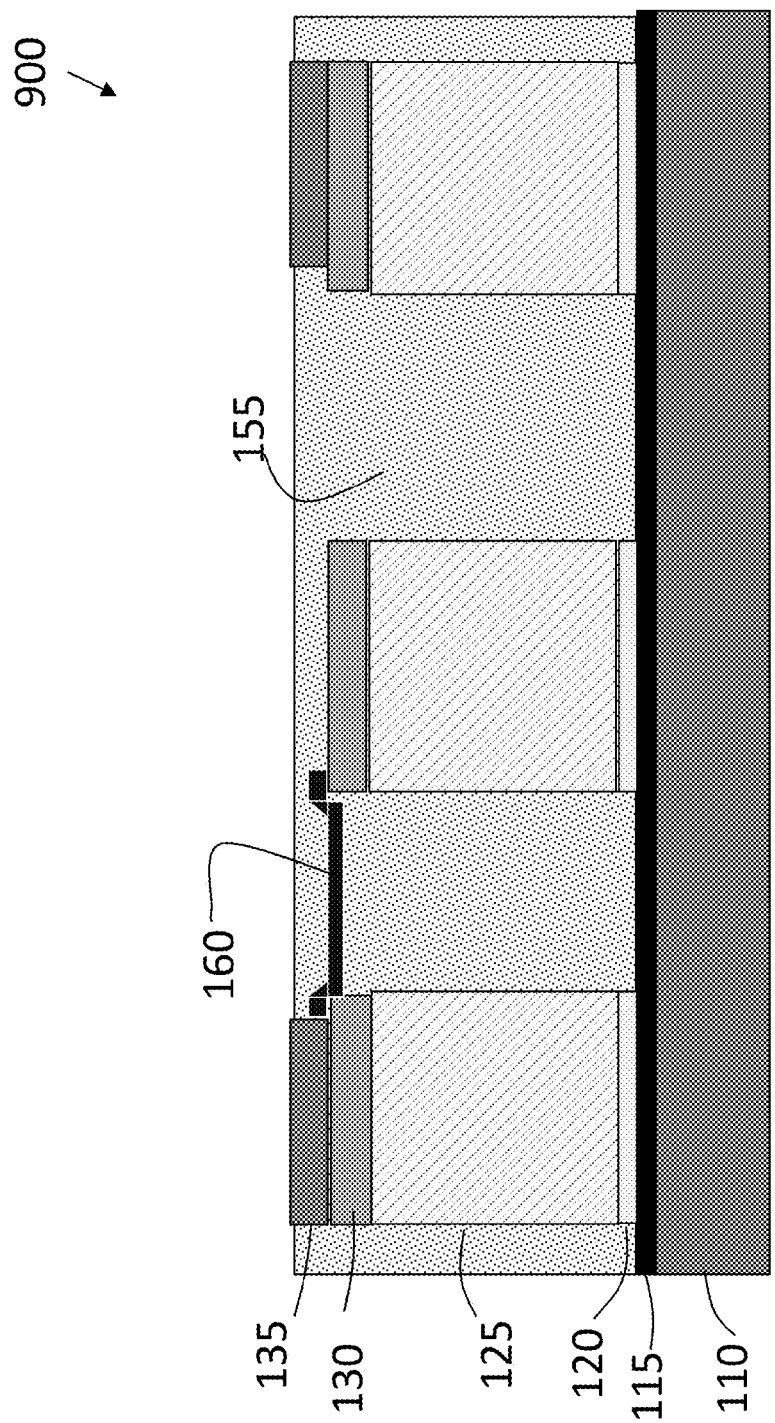
FIG. 9 illustrates another stage in the fabrication of a PET device according to an embodiment of the invention.
Figure 10:
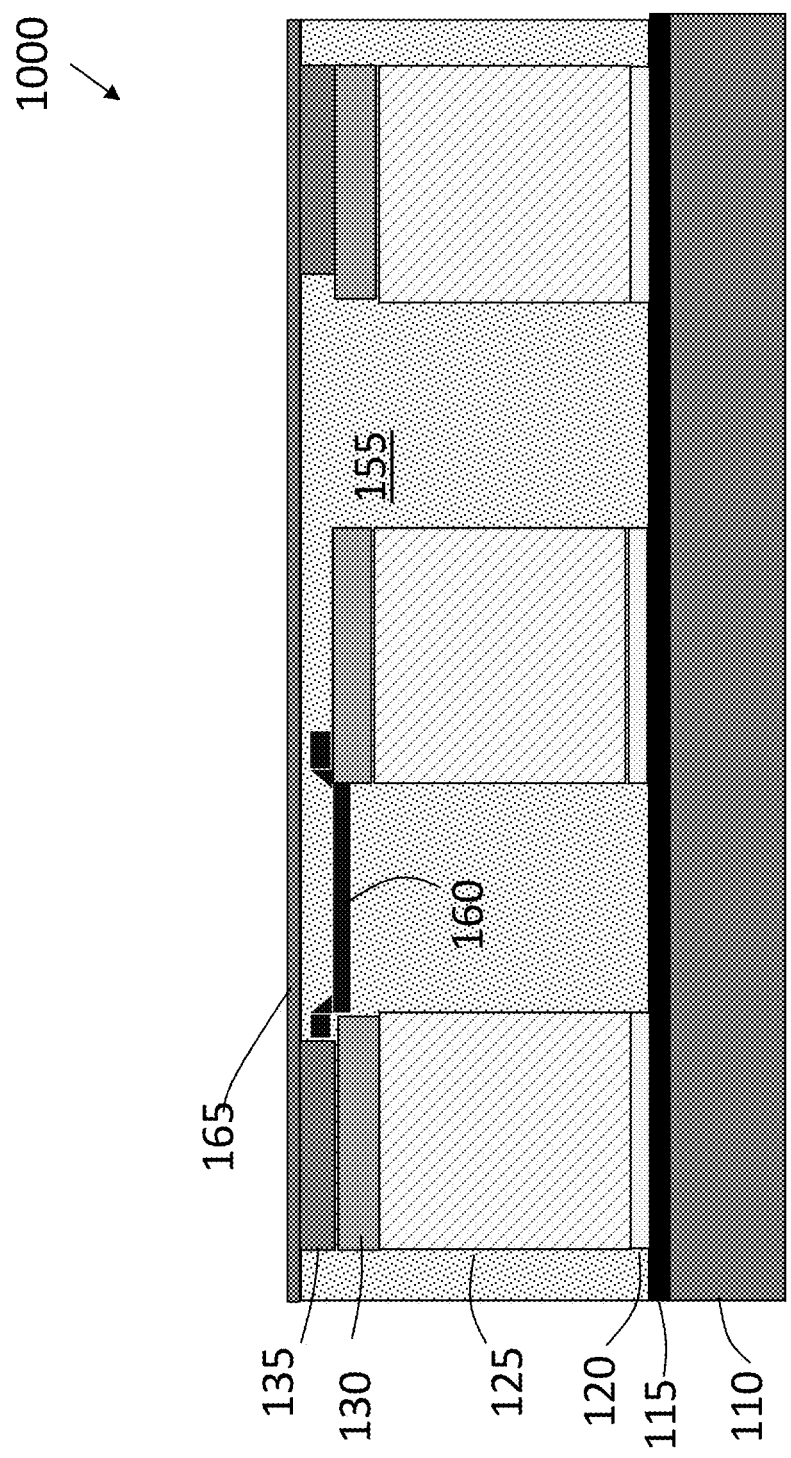
FIG. 10 illustrates another stage in the fabrication of a PET device according to an embodiment of the invention.
Figure 11:
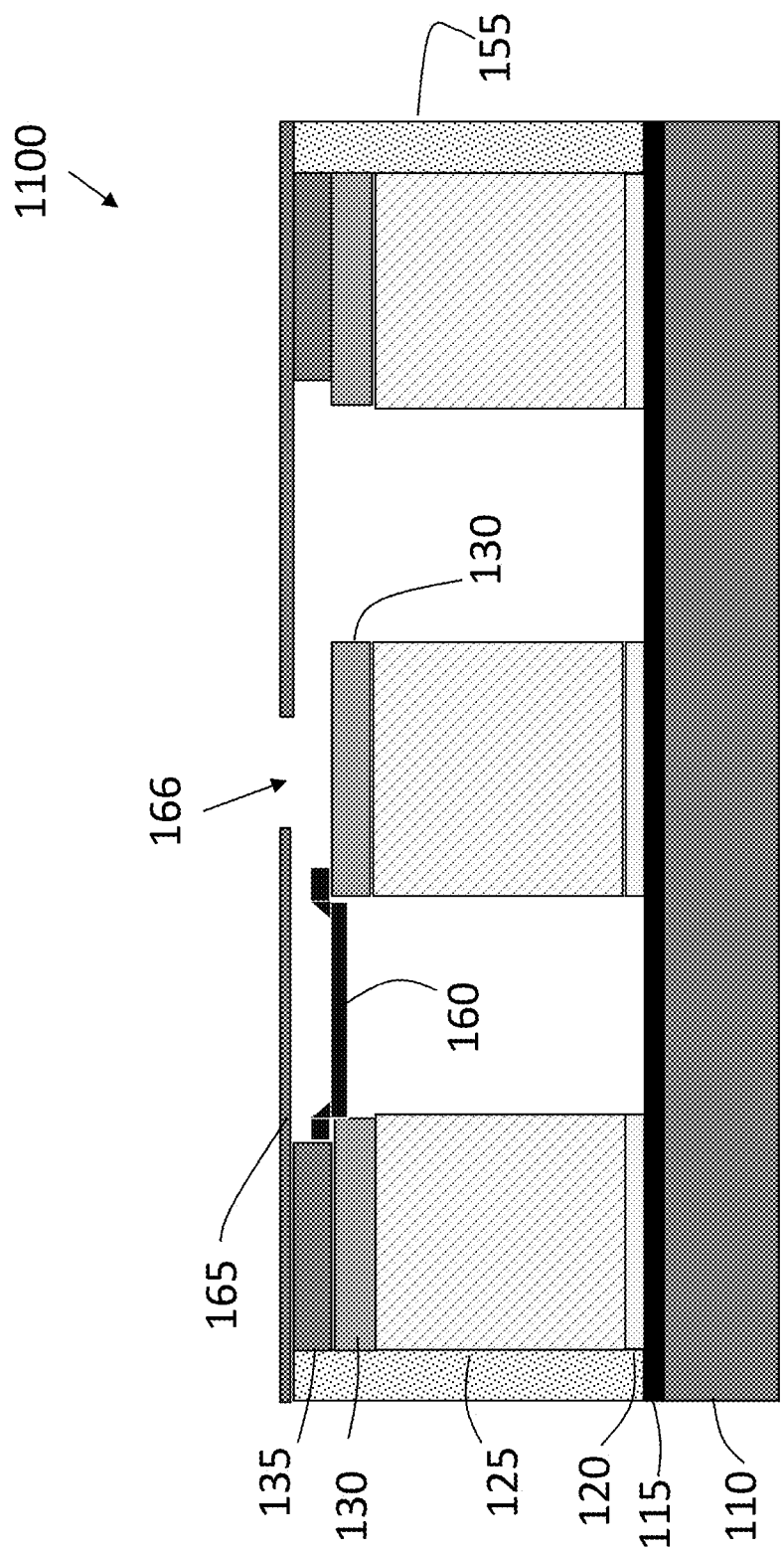
FIG. 11 illustrates another stage in the fabrication of a PET device according to an embodiment of the invention.
Figure 12:
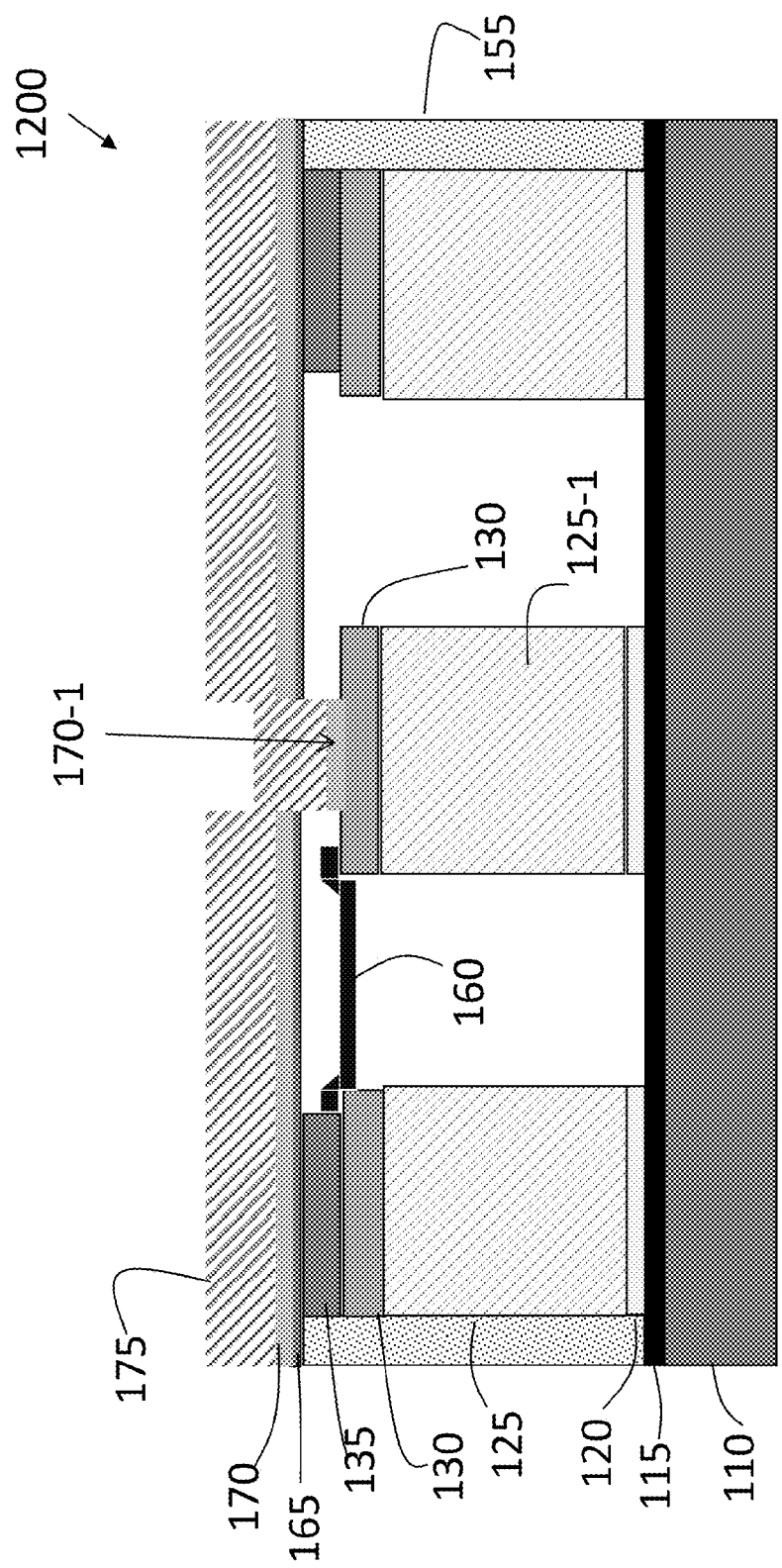
FIG. 12 illustrates another stage in the fabrication of a PET device according to an embodiment of the invention.

FIG. 8 illustrates another stage 800 in the fabrication of a PET device according to an embodiment of the invention. A metal cantilever 160 is defined joining the M1 layers 130 of the central pillar 510 and the annular ring (520). This metal cantilever 160 is defined by lithography in combination with physical vapor deposition of the metal and either liftoff of a resist mask or RIE through a resist mask. As FIG. 8 indicates, the cantilever 160 will act as a flexible bridge that supplies voltage to the center PE material 125-1. FIG. 9 illustrates another stage 900 in the fabrication of a PET device according to an embodiment of the invention. Additional Si 155 is deposited as shown and planarized using CMP. The distance between the M1 layer 130 and the top of the Si 155 defines the thickness of the subsequent PR element 170 (FIG. 12). FIG. 10 illustrates another stage 1000 in the fabrication of a PET device according to an embodiment of the invention. A thin SiN membrane 165 is deposited above the SiN layer 135 and the Si 155. FIG. 11 illustrates another stage 1100 in the fabrication of a PET device according to an embodiment of the invention. A small circular deposition window 166 is etched (via RIE and electron beam lithography) in the SiN membrane 165, and the sacrificial silicon fill (Si 155) is removed with a xenon difluoride ($XeF_2$) etch. This releases the central pillar 510, the SiN membrane 165 layer and the contact cantilever 160. Generally, the circular deposition window 166 is sized to have a diameter larger than the distance between the bottom of the SiN membrane 165 layer and the top of the M1 layer 130. The pressure in the PR element 170-1 (FIG. 12) (which is caused by displacement of the PE material 125 and which results in a change in resistive state) will scale with the volume of the compressed PR element 170-1. Thus, thickness of the PR element 170 is minimized to achieve good piezo response.

Figure 13:
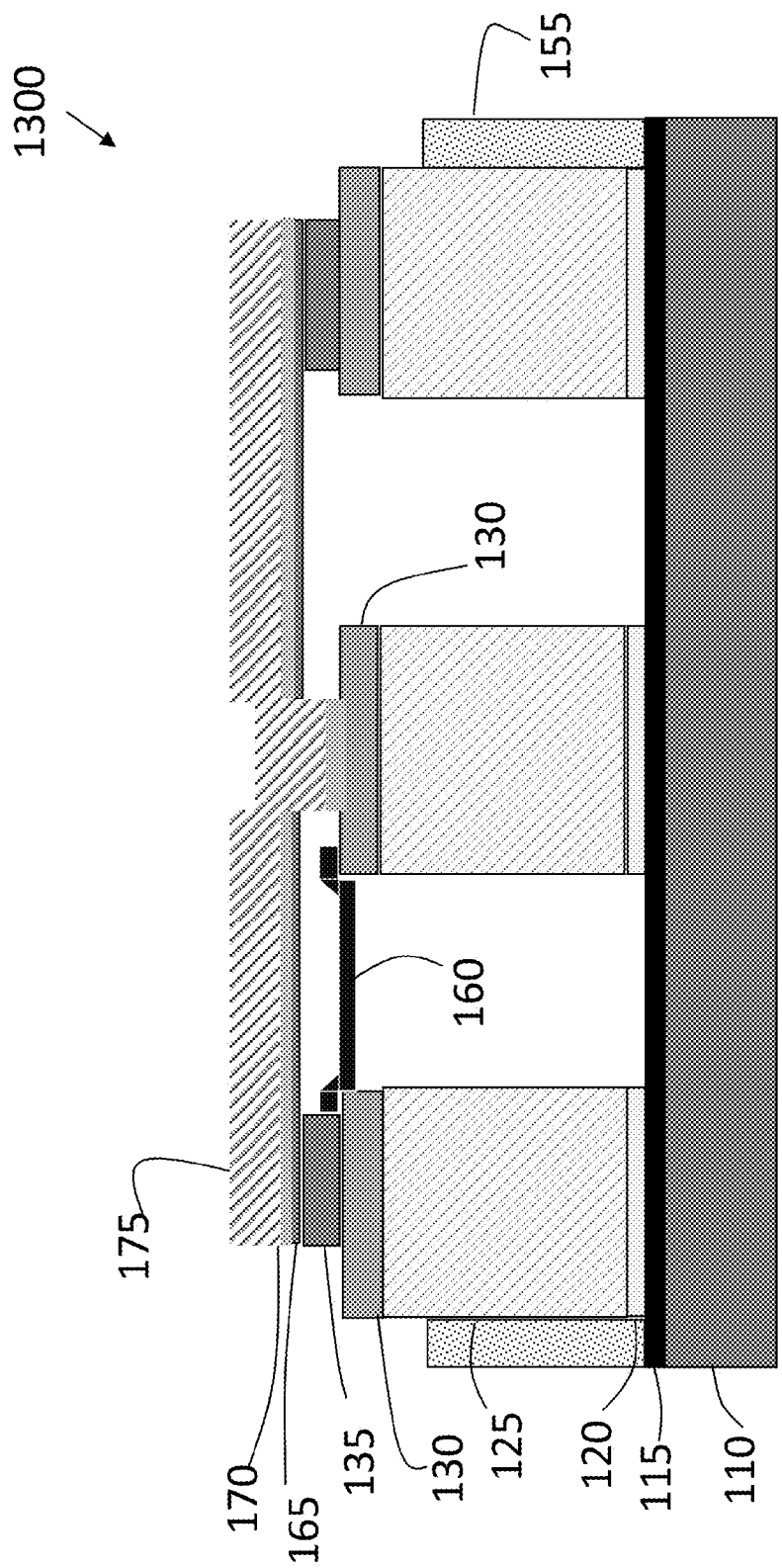
FIG. 13 illustrates another stage in the fabrication of a PET device according to an embodiment of the invention.
Figure 14:
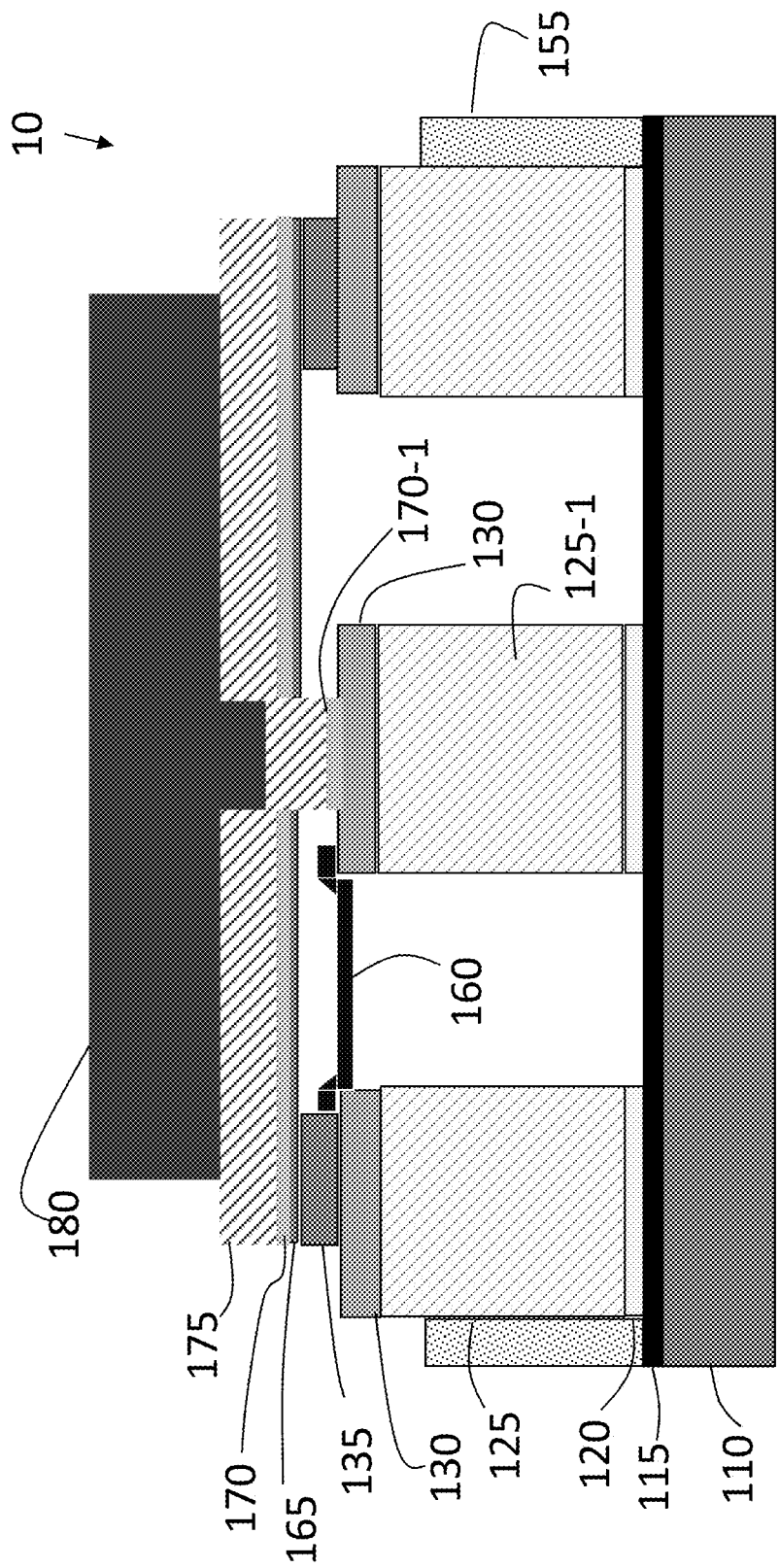
FIG. 14 is a cross sectional block diagram of the PET device according to an embodiment of the invention.

FIG. 12 illustrates another stage 1200 in the fabrication of a PET device according to an embodiment of the invention. The SiN membrane 165 defined in stages 1000-1100 constitutes a local shadow mask. In stage 1200, the PR element 170 and a titanium nitride (TiN) cap 175 are deposited through this mask resulting in a local PR pillar (PR element 170-1 in contact with the central PE material 125-1 stack). This deposition also closes all of the openings used to release the Si 155 in stage 1100. Thus at stage 1200, the device shown is hermetically sealed and should not age. The PR element 170-1 does not have a sidewall that will reduce its modulation, as in prior devices. As noted above, the PR element 170 may be SmSe, for example, or may be SmS, SmTe, or TmTe. Other materials that may be used as the PR element 170 are discussed below. FIG. 13 illustrates another stage 1300 in the fabrication of a PET device according to an embodiment of the invention. The PR element 170 and TiN cap 175 are etched back via a lithographically defined RIE. As a result, individual PET devices 10 on a wafer are electrically separated. FIG. 14 is a cross sectional block diagram of the PET device 10 according to an embodiment of the invention. An aluminum (Al) layer 180 is added. The Al layer 180 prevents the TiN cap 175 from bending and acts as a clamp that is anchored in place despite displacement of the PE 125-1.

Figure 16:
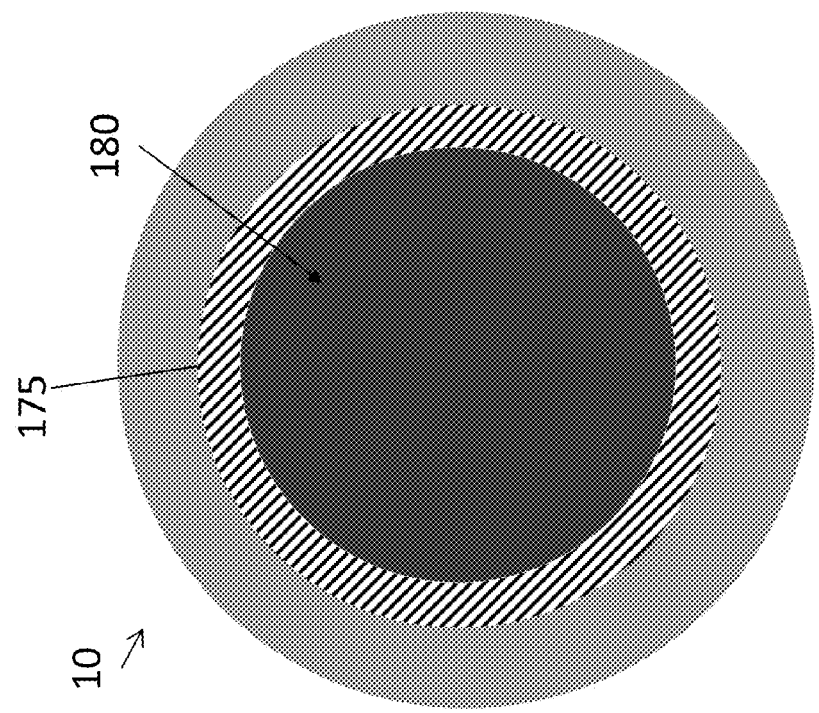
FIG. 16 is a perspective top-down cross sectional view of the PET device according to an embodiment of the invention.
Figure 15:
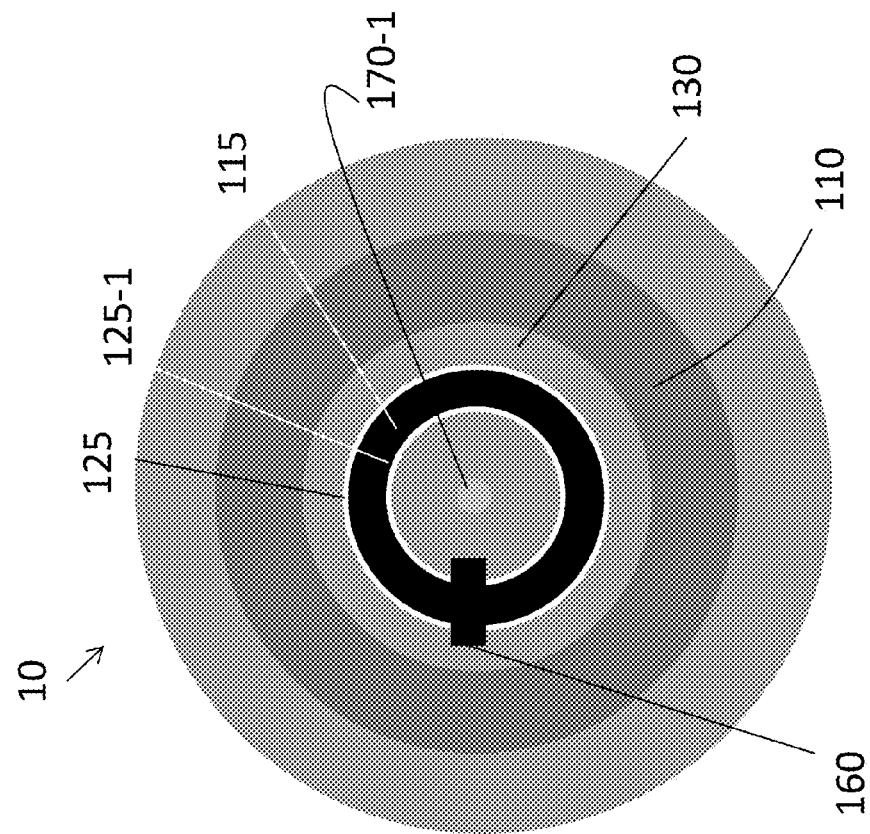
FIG. 15 is a perspective top-down cross sectional view of an aspect of the PET device according to an embodiment of the invention.

FIGS. 15 and 16 depict a perspective top-down view of aspects of the PET device 10. FIG. 15 is a perspective top-down cross sectional view of an aspect of the PET device 10 according to an embodiment of the invention. The PET device 10 is shown without the Al layer 180 and portions of the PR element 170, the TiN cap 175, and the SiN membrane 165 to expose the active PR element 170-1. FIG. 16 is a perspective top-down view of the PET device 10 according to an embodiment of the invention.

Figure 17:
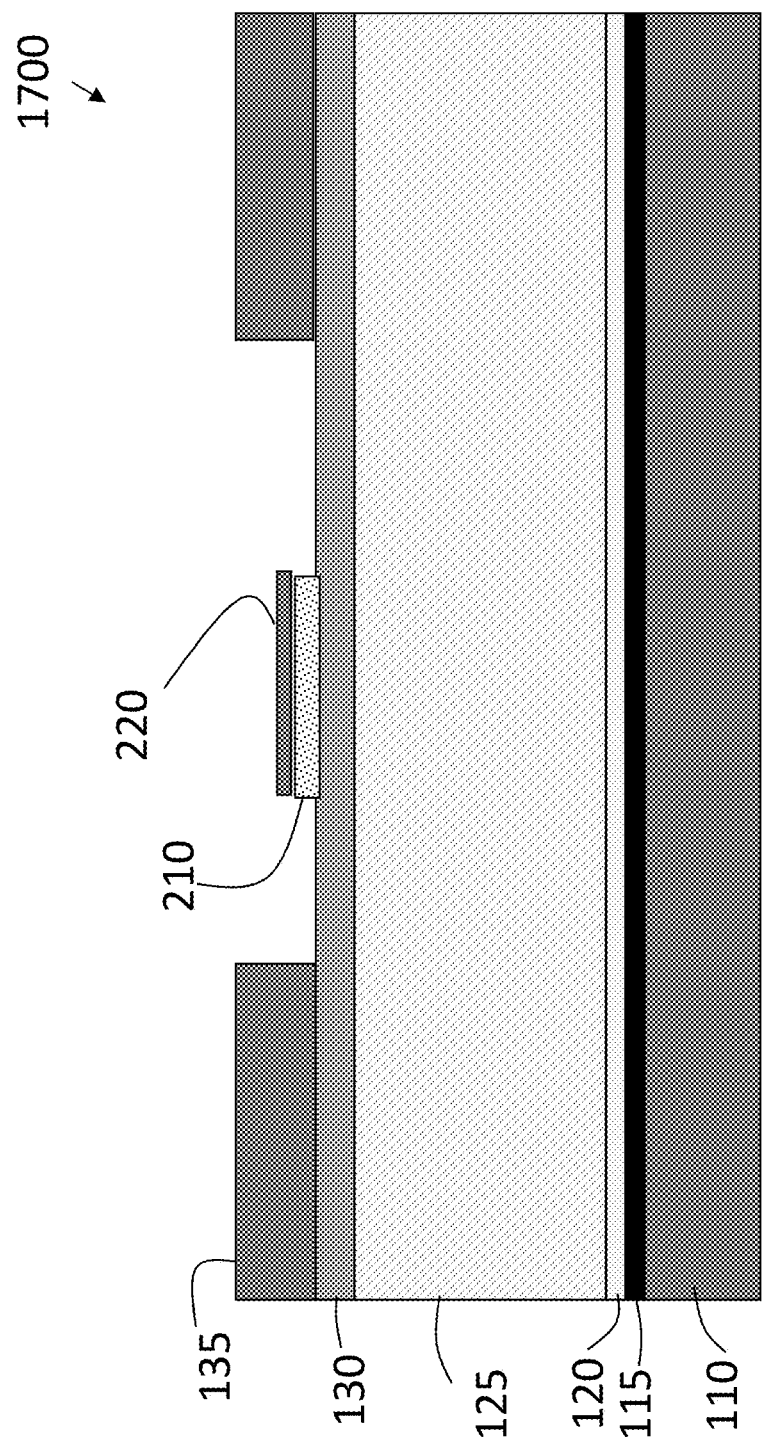
FIG. 17 shows a stage in the fabrication of a PET device according to another embodiment of the invention.
Figure 18:
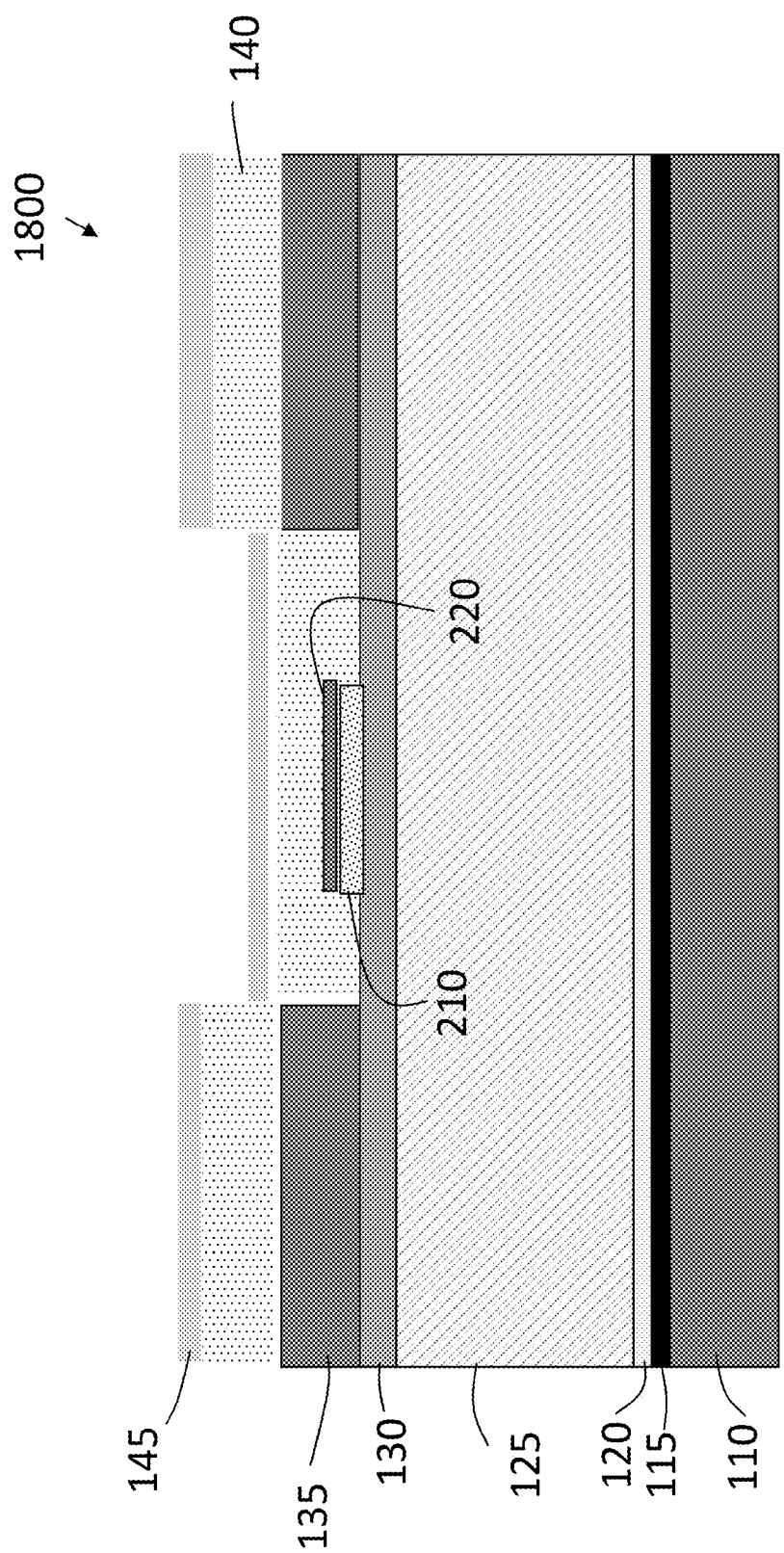
FIG. 18 shows another stage in the fabrication of a PET device according to another embodiment of the invention.
Figure 19:
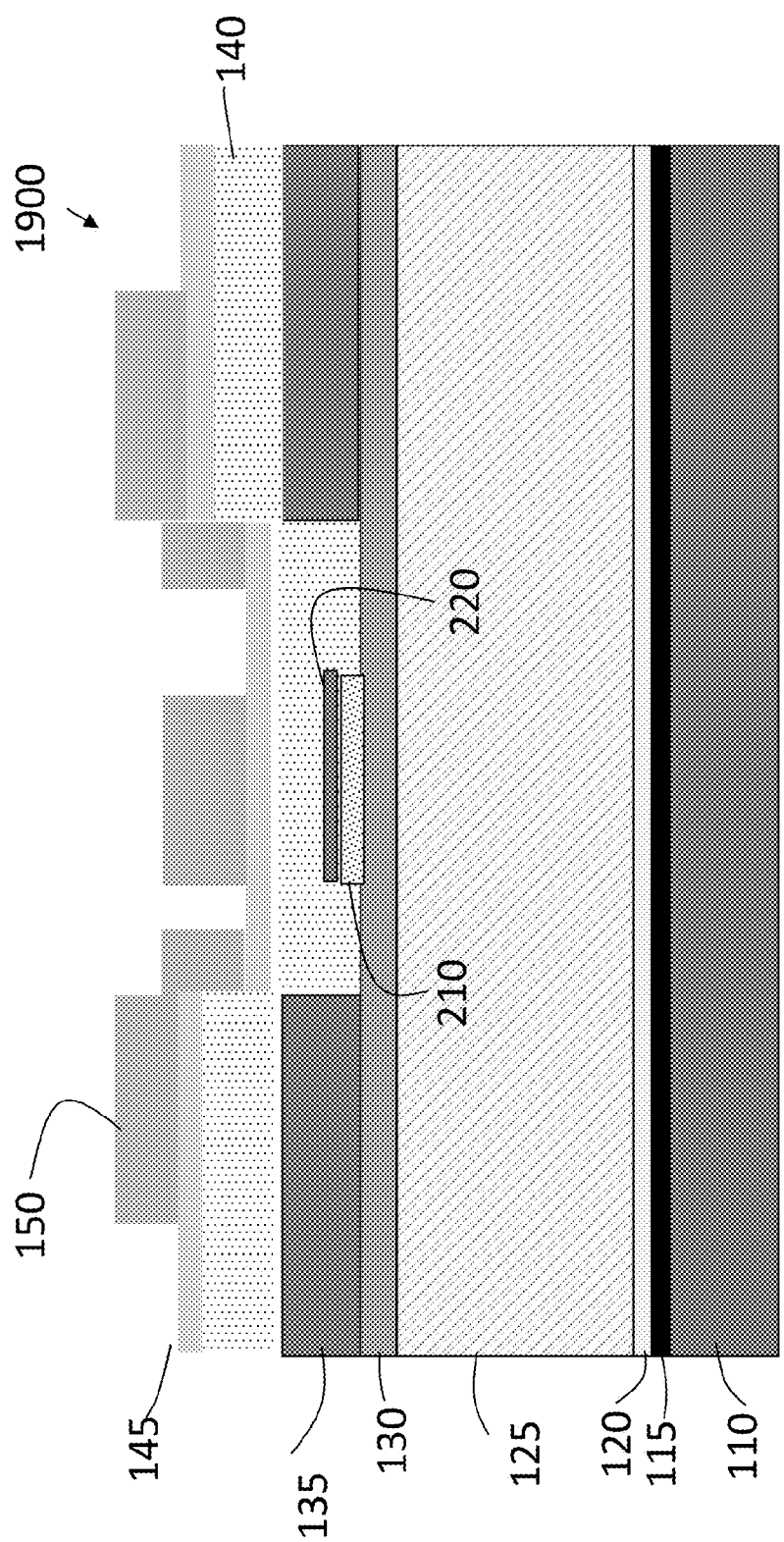
FIG. 19 shows another stage in the fabrication of a PET device according to another embodiment of the invention.
Figure 20:
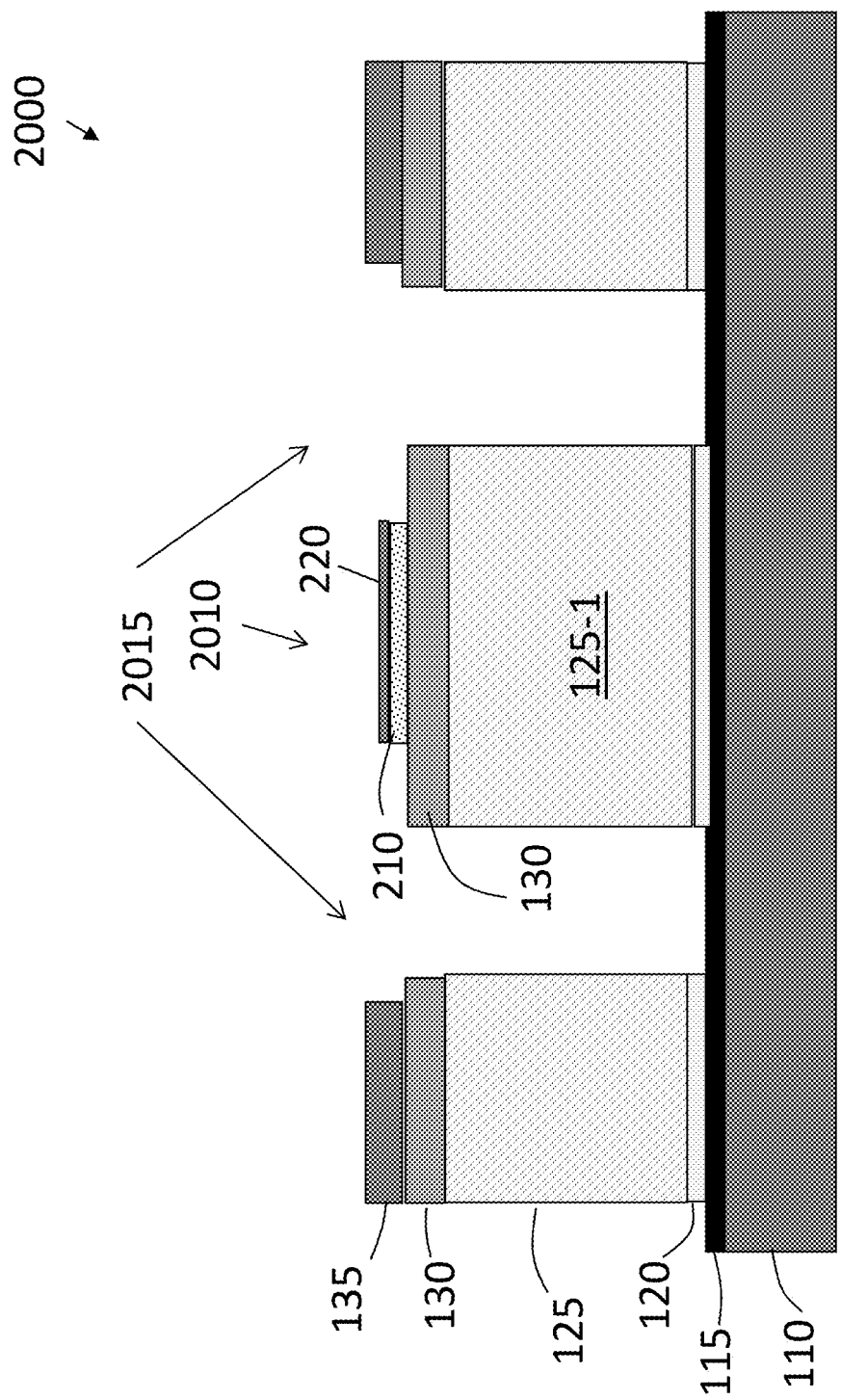
FIG. 20 shows another stage in the fabrication of a PET device according to another embodiment of the invention.
Figure 21:
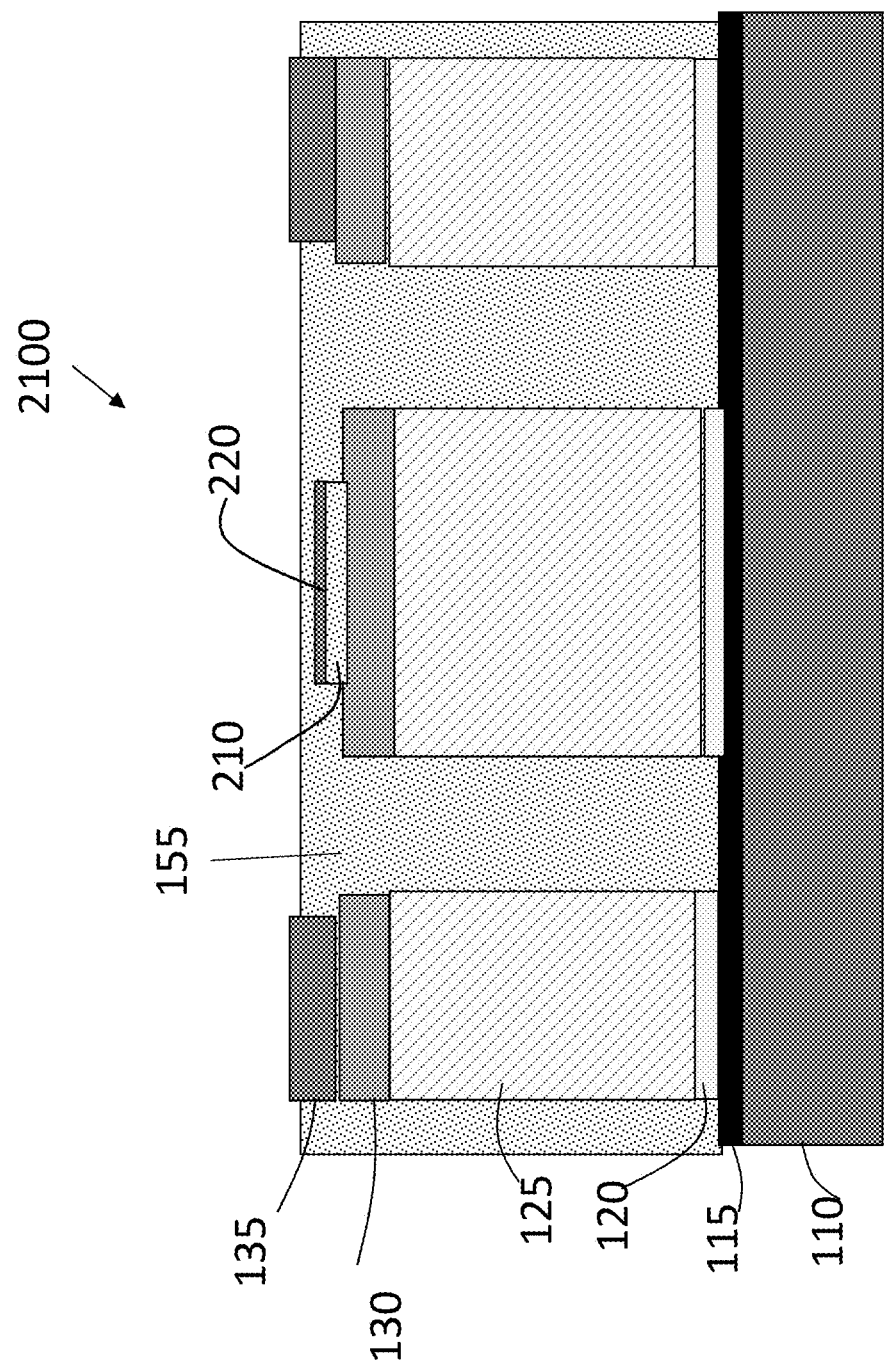
FIG. 21 shows another stage in the fabrication of a PET device according to another embodiment of the invention.

FIGS. 17-32 illustrate stages in the fabrication of a PET device 20 according to another embodiment of the invention. The stages shown in FIGS. 17-32 begin with the stage 100 shown in FIG. 1. While the processes illustrated in several of the figures according to this alternate embodiment are the same as for the embodiment illustrated in FIGS. 1-14 (and labels are reused for many of the layers), the deposition window 245 (FIG. 29) for the PR 170 (FIG. 30) is different than the deposition window 166 (FIG. 11). FIG. 17 shows a stage 1700 in the fabrication of a PET device 20 according to another embodiment of the invention. The SiN layer 135 of stage 100 is etched and a disk of Si 210 and SiN membrane 220 (or atomic layer deposition (ALD) film) is created on the M1 layer 130. FIG. 18 shows another stage 1800 in the fabrication of a PET device 20 according to another embodiment of the invention. A W layer 140 and Pt layer 145 are deposited as electroplating seed layers. FIG. 19 shows another stage 1900 in the fabrication of a PET device 20 according to another embodiment of the invention. Ni 150 is electroplated on the Pt layer 145 inside areas not masked by a photoresist. FIG. 20 shows another stage 2000 in the fabrication of a PET device according to another embodiment of the invention. The PE material 125, M1 130, W 140 and Pt 145 are etched. After this the W layer 140, Pt layer 145, and Ni 150 are removed by a wet chemical etch. The creates the central pillar 2010 that includes the PE material 125-1 that will be displaced based on a voltage application and annular ring 2015. FIG. 21 shows another stage 2100 in the fabrication of a PET device 20 according to another embodiment of the invention. Si 155 is deposited and CMP is used to planarize the structure.

Figure 22:
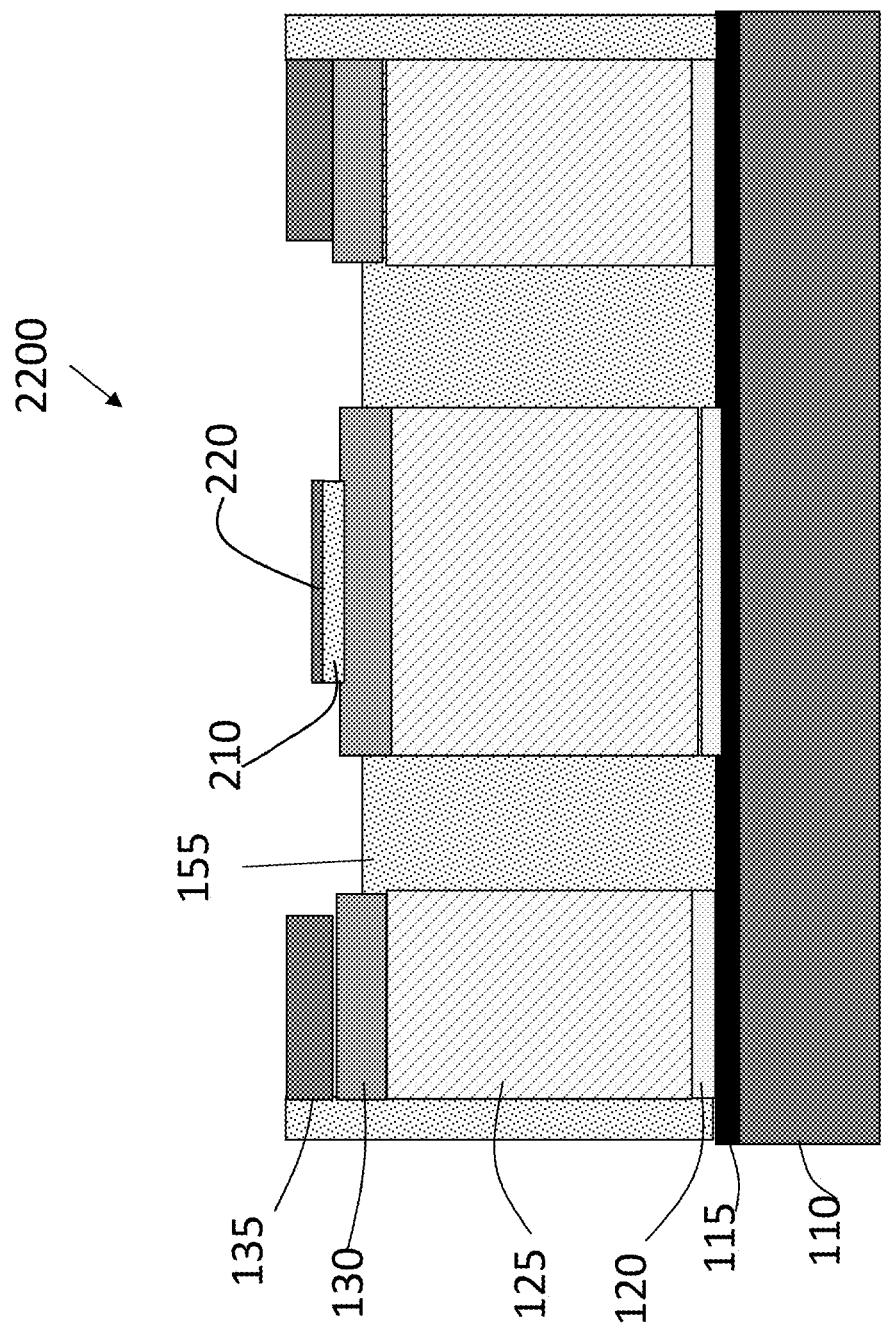
FIG. 22 shows another stage in the fabrication of a PET device according to another embodiment of the invention.
Figure 23:
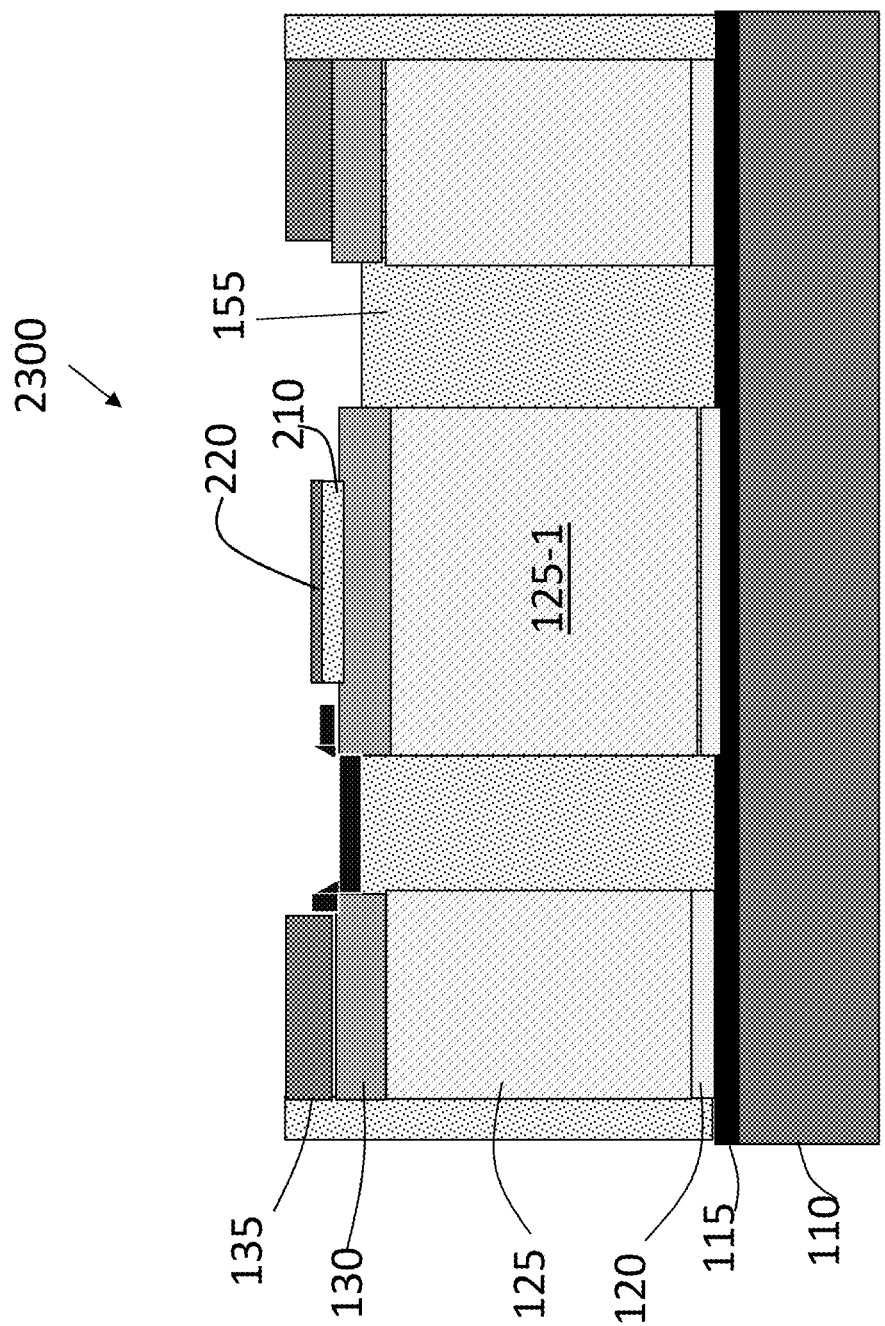
FIG. 23 shows another stage in the fabrication of a PET device according to another embodiment of the invention.
Figure 24:
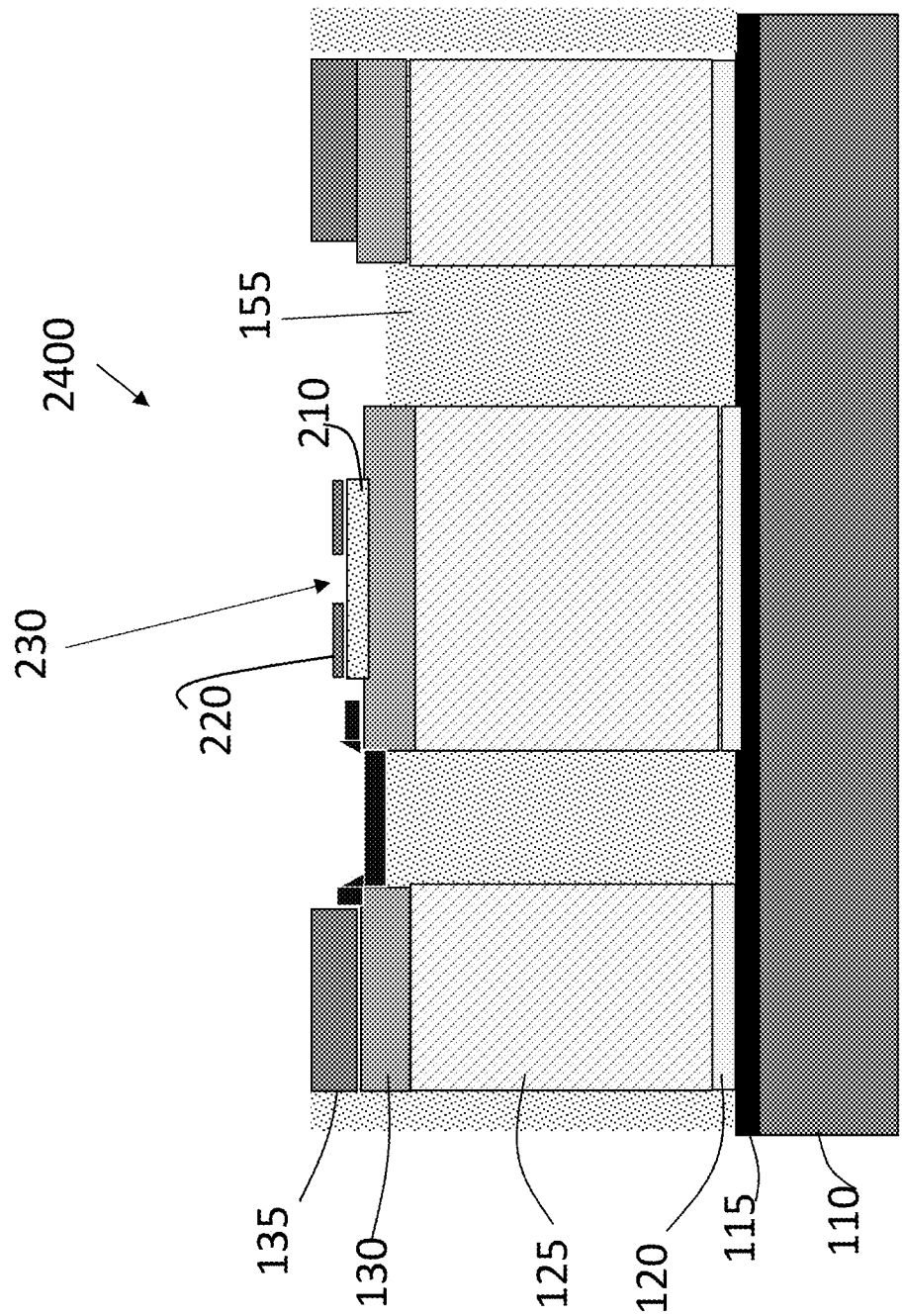
FIG. 24 shows another stage in the fabrication of a PET device according to another embodiment of the invention.
Figure 25:
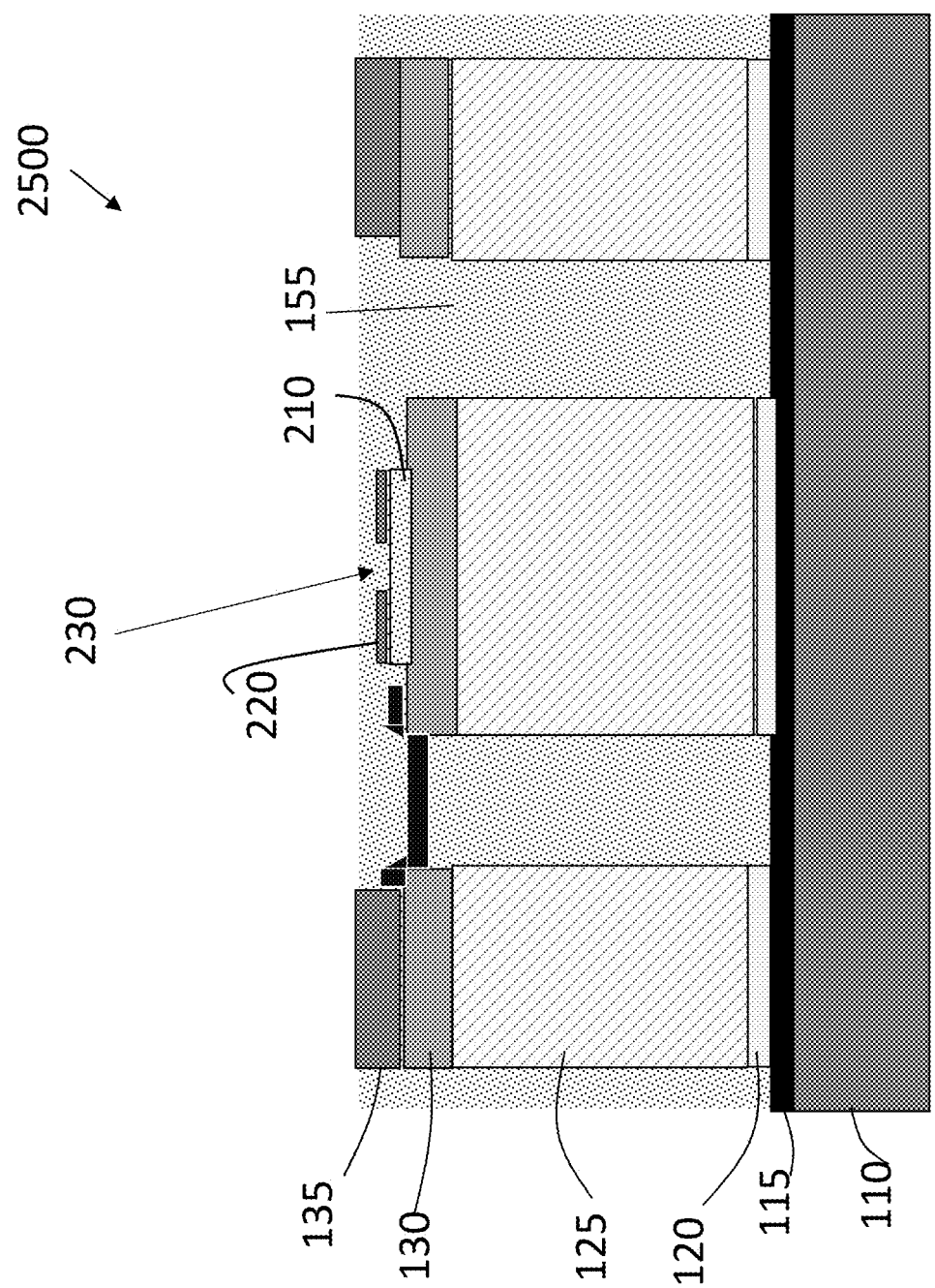
FIG. 25 shows another stage in the fabrication of a PET device according to another embodiment of the invention.
Figure 26:
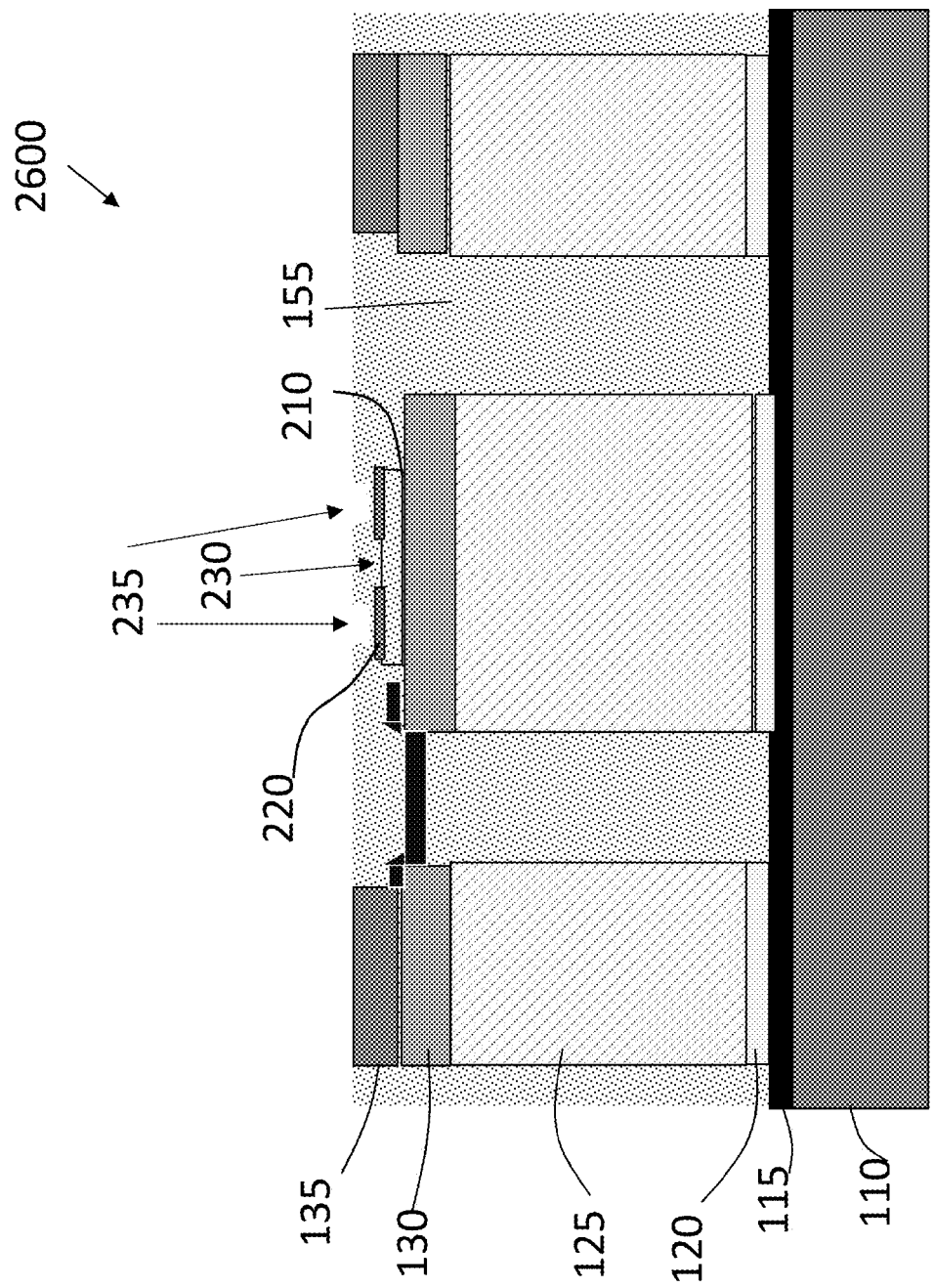
FIG. 26 shows another stage in the fabrication of a PET device according to another embodiment of the invention.
Figure 27:
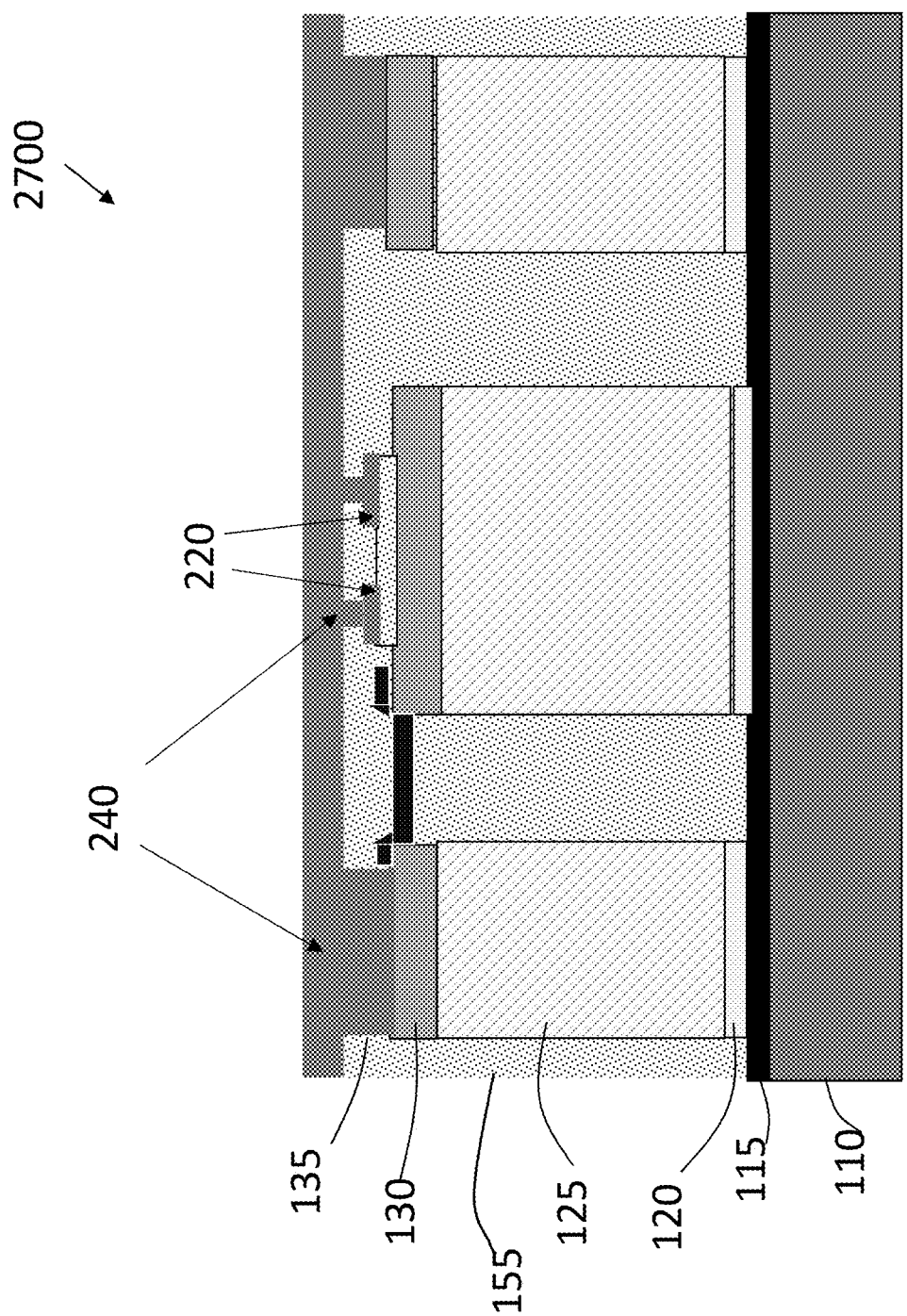
FIG. 27 shows another stage in the fabrication of a PET device according to another embodiment of the invention.
Figure 28:
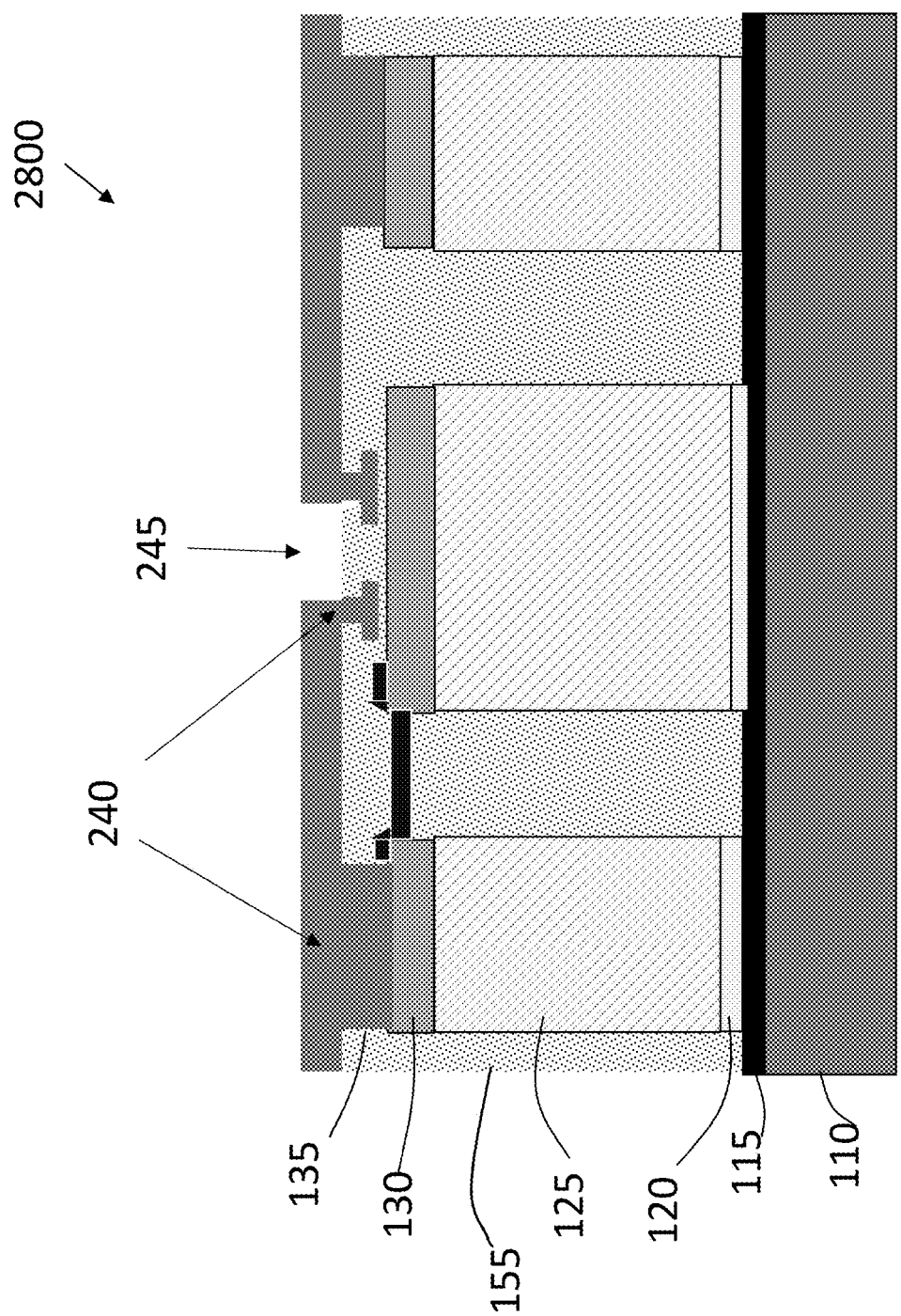
FIG. 28 shows another stage in the fabrication of a PET device according to another embodiment of the invention.
Figure 29:
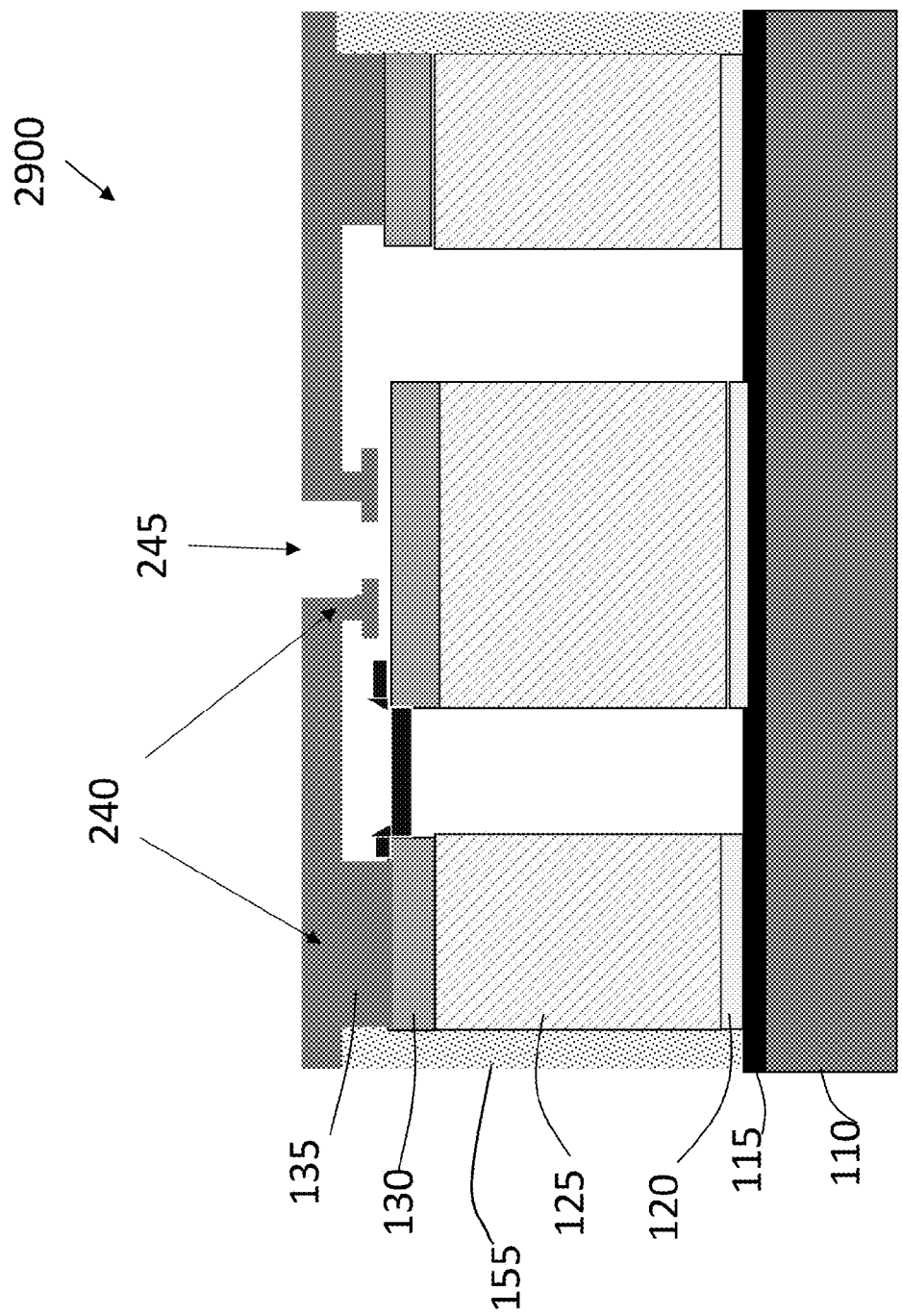
FIG. 29 shows another stage in the fabrication of a PET device according to another embodiment of the invention.

FIG. 22 shows another stage 2200 in the fabrication of a PET device 20 according to another embodiment of the invention. The Si 155 is recessed via RIE in the central portion of the structure shown in stage 2100. FIG. 23 shows another stage 2300 in the fabrication of a PET device 20 according to another embodiment of the invention. A metal cantilever 160 is defined joining the M1 layers 130 of the central metal pillar 2010 and the annular ring 2015. This metal cantilever 160 is defined by lithography in combination with physical vapor deposition of the metal and either liftoff of a resist mask or reactive ion etching through a resist mask. FIG. 24 shows another stage 2400 in the fabrication of a PET device 20 according to another embodiment of the invention. A small hole 230 is etched in the SiN membrane 220 via RIE combined with electron beam lithography. This hole 230 forms an integral part of the deposition window for the PR layer (170, FIG. 30) later in the process. This process (formation of the hole 230) differentiates the current embodiment from the embodiment discussed with reference to FIGS. 1-14 because the gap between the SiN membrane 220 and the M1 layer 130 surface is defined by the thickness of a thin film (Si 210) rather than via CMP. While electron beam lithography is used to etch the hole 230, the other RIE steps according to the current embodiment use resist and photolithography. FIG. 25 shows another stage 2500 in the fabrication of a PET device 20 according to another embodiment of the invention. Si 155 is deposited and planarized using CMP. FIG. 26 shows another stage 2600 in the fabrication of a PET device 20 according to another embodiment of the invention. The contact annulus 235 is etched via RIE to the lower membrane (SiN 220). FIG. 27 shows another stage 2700 in the fabrication of a PET device 20 according to another embodiment of the invention. Another SiN membrane 240 is deposited over the SiN layer 135 and in the annulus 235 above the SiN membrane 220. FIG. 28 shows another stage 2800 in the fabrication of a PET device 20 according to another embodiment of the invention. A window 245 is etched via a lithographically defined RIE in the SiN membrane 240. The window 245 combined with the hole 230 form the composite PR deposition window for the current embodiment. FIG. 29 shows another stage 2900 in the fabrication of a PET device 20 according to another embodiment of the invention. A dry release etch process using xenon difluoride ($XeF_2$) is used to remove the Si 210 and Si 155.

Figure 30:
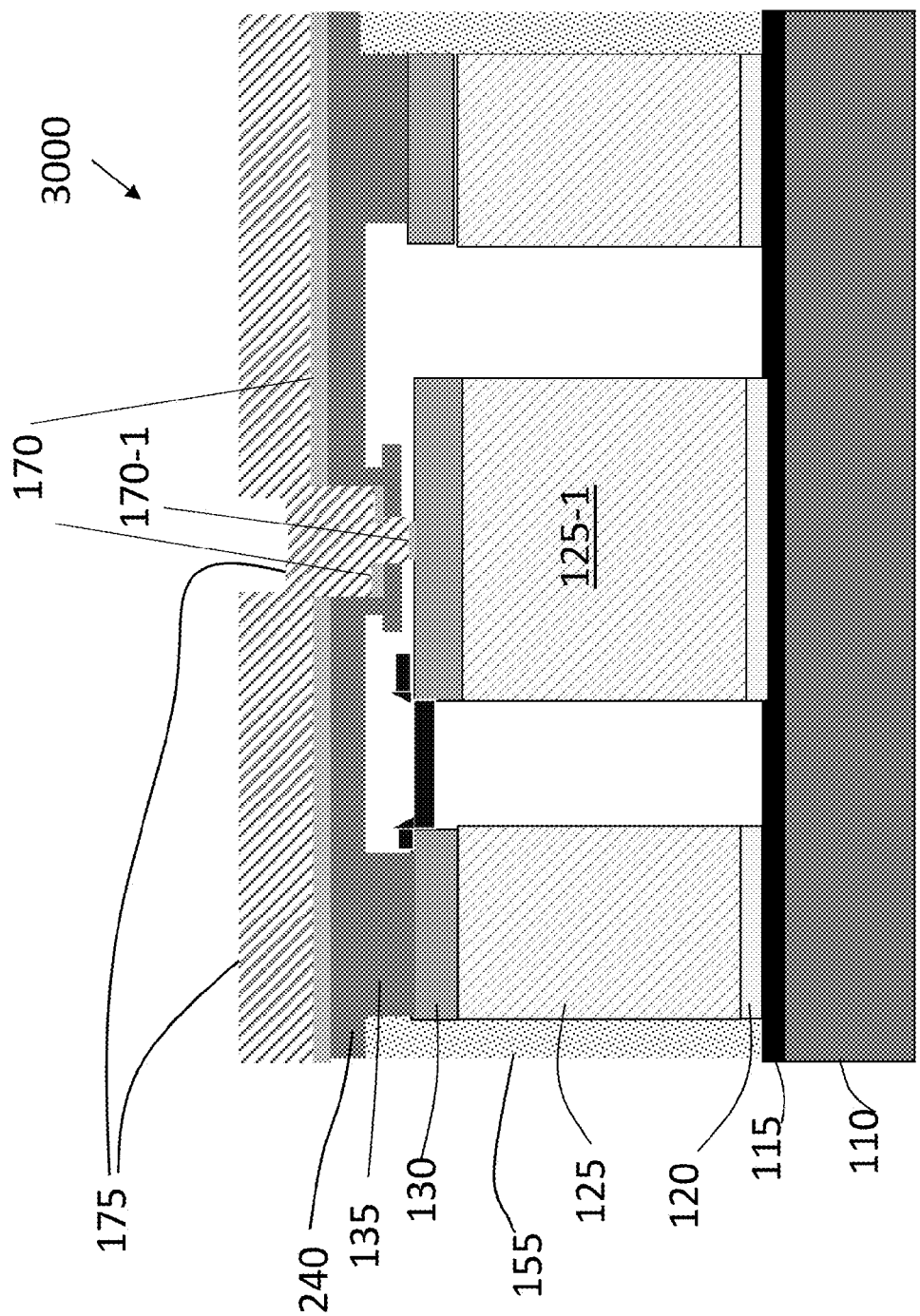
FIG. 30 shows another stage in the fabrication of a PET device according to another embodiment of the invention.
Figure 31:
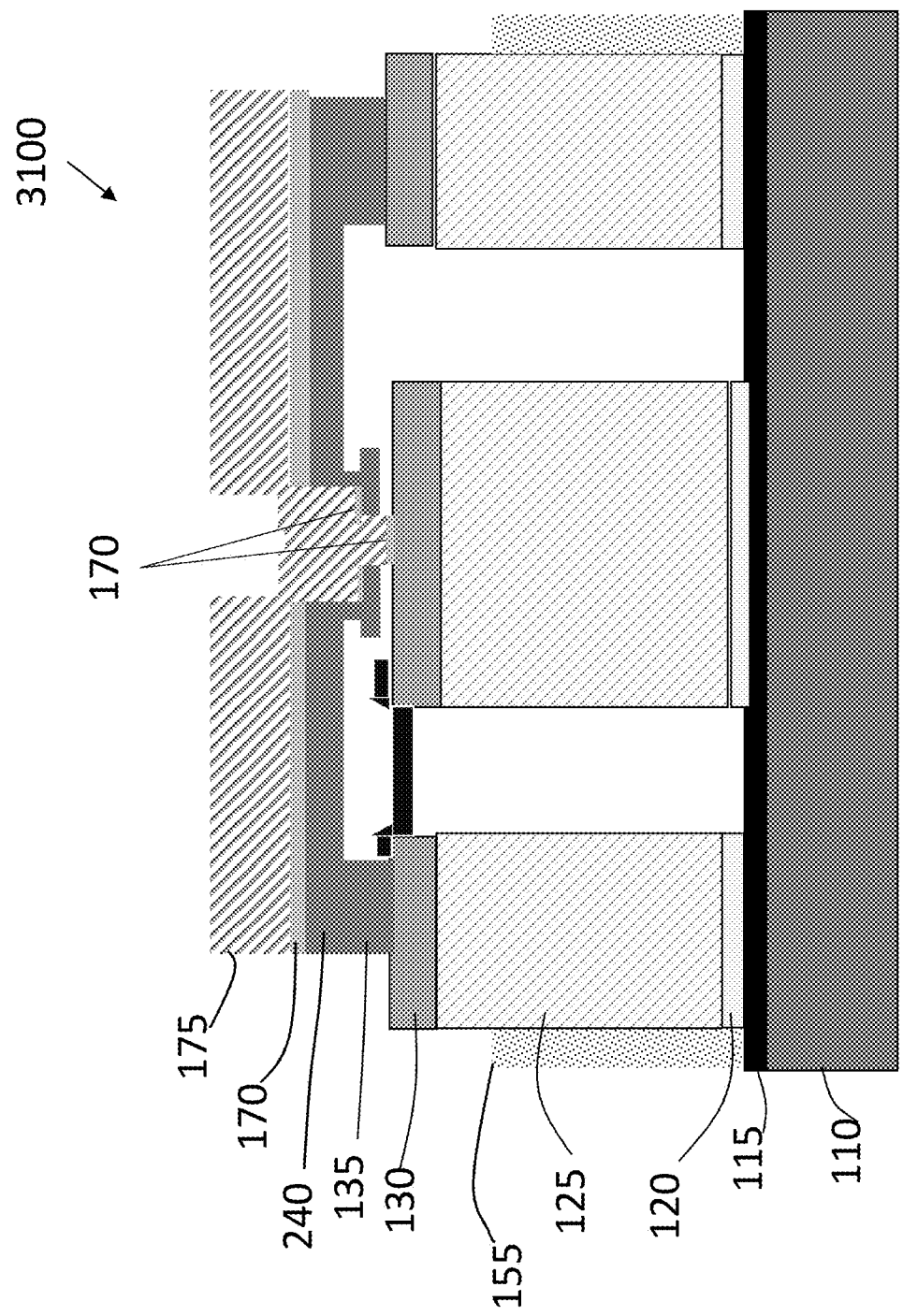
FIG. 31 shows another stage in the fabrication of a PET device according to another embodiment of the invention.
Figure 32:
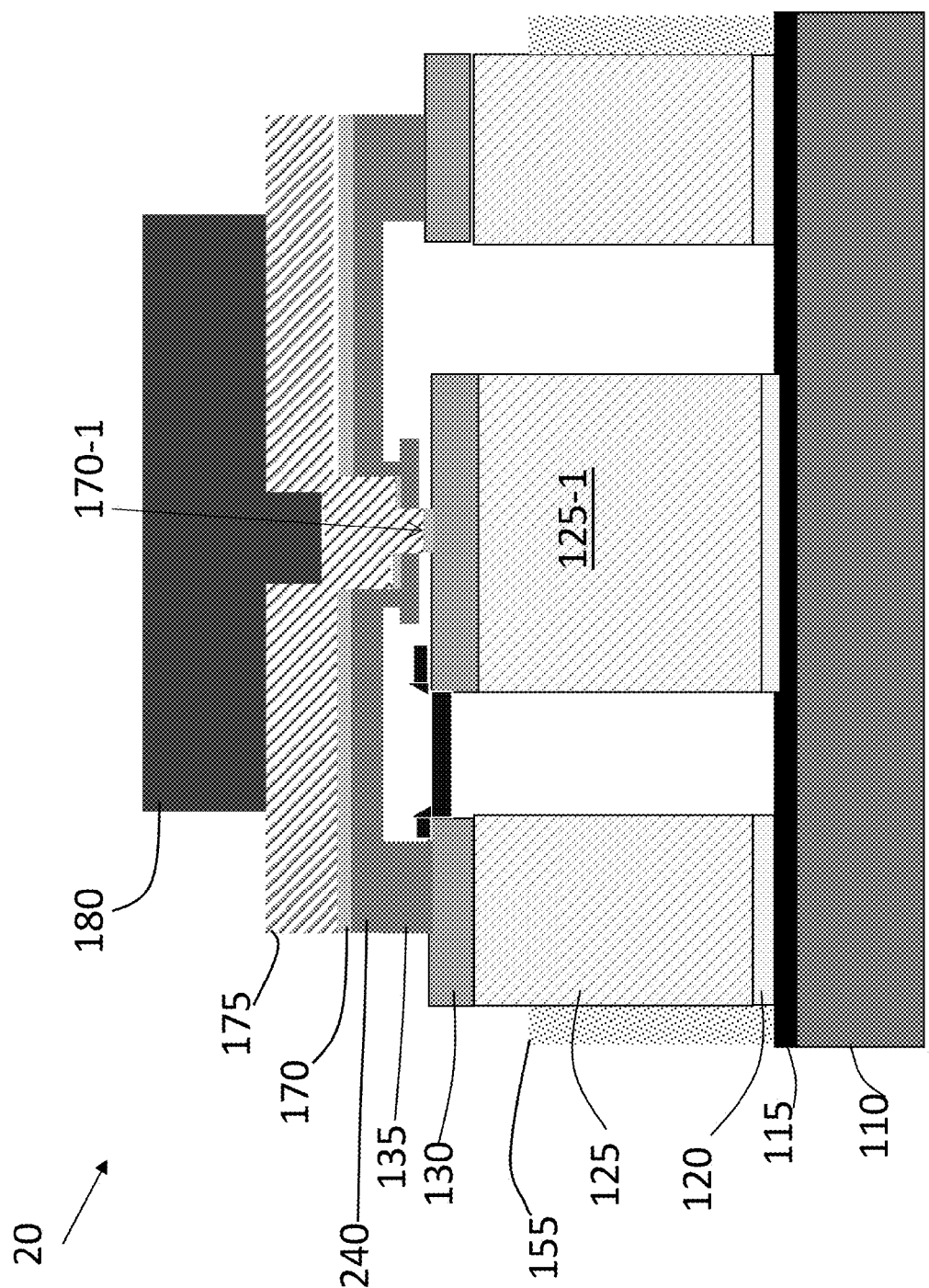
FIG. 32 is a cross sectional block diagram of the PET device according to another embodiment of the invention.

FIG. 30 shows another stage 3000 in the fabrication of a PET device 20 according to another embodiment of the invention. The deposition window (window 245 and hole 230) formed in the stages preceding stage 3000 constitutes a local shadow mask. In stage 3000 the PR element 170 and a titanium nitride (TiN) cap 175 are deposited through this mask resulting in a local PR element 170-1 pillar in contact with the central PE material 125-1 stack 2010. This deposition also closes all of the openings used to release the silicon layer (Si 210 and Si 155) in stage 2900. Thus, the device shown at stage 3000 is hermetically sealed and should not age. FIG. 31 shows another stage 3100 in the fabrication of a PET device 20 according to another embodiment of the invention. The PR element 170 and TiN cap 175 are etched back via a lithographically defined RIE. FIG. 32 is a cross sectional block diagram of the PET device 20 according to another embodiment of the invention. An aluminum (Al) layer 180 is added to the structure as discussed above. The Al layer 180 acts as a clamp that is anchored in place despite displacement of the central portion PE material 125-1. A comparison of FIG. 14 with FIG. 32 indicates the difference between the two exemplary embodiments with regard to the deposition of the PR element 170-1 above the M1 layer 130. In the embodiment associated with FIG. 32, the SiN deposition window 245 may be closer to the M1 layer 130 than in the embodiment associated with FIG. 14. This is because of two factors. First, the thickness between the window 245 and the M1 layer 130 surface is defined by the thickness of a thin film (Si 210) rather than CMP. Second, the SiN membrane 220 close to the M1 layer 130 does not need to be as wide as the entire device, thus it may be made thinner without risking buckling. As a result, the thickness of the PR element 170 may be less for the PET device 20 than for the PET device 10.

The SiN membrane 240 must be under tensile stress to not buckle and touch the M1 layer 130. The SiN membrane 240 must also be far enough away from the M1 layer 130 such that Van der Waal forces do not pull the SiN membrane 240 in. The release etch discussed with reference to FIG. 29 is done as a gas phase process to prevent pull-in of the SiN membrane 240 due to strong wetting forces. The SiN membrane 240 must be kept dry until the PR element 170 is deposited. Thus, an in-situ $XeF_2$ release inside the same vacuum system that deposits the PR layer 170 and capping layer 175 may be most effective. The distance between the M1 layer 130 and the SiN membrane 240 should generally be less than the diameter of the SiN membrane 240 opening (window 245). Volume of the PR element 170 may be scaled down to reach higher pressures. There is no lower bound on thickness of the PR element 170 and, thus, on the volume. The speed of the PET device 10, 20 depends on total stack height. Thus, to achieve maximum speed of the PET device 10, 20, distance between the SiN membrane 240 and the M1 layer 130 should be minimized. The thickness of the PR element 170 should be less than the thickness of the window 245 to prevent clamping part of the PR element 170 by the SiN membrane 240 which is made rigid by the subsequent metal deposition steps. The hermetically sealed device (PET device 10, 20) will not become oxidized because the PE material 125 typically has very low partial pressures of oxygen in vacuum.

In alternatives to both of the exemplary embodiments discussed above, the TiN cap 175 may instead be comprised of a stack of metals such as, for example, Pt/TiN/Pt, titanium aluminum nitride (TiAlN) and TiN, Pt/TiN, and palladium (Pd) and TiN. The M1 layer 130 may be a stack of metals that are resistant to $XeF_2$ and with a bottom metal of the stack that does not reduce the PE material 125. For example, the M1 layer 130 may be comprised of ruthenium (Ru)/TiAlN/Pt, ruthenium oxide ($RuO_2$)/TiN/Pd, or iridium oxide ($IrO_2$)/Pt. In alternate embodiments, the SiN membrane 240 may be comprised of ALD films such as $HfO_2$ or aluminum oxide (Al2O3). In addition to the above-discussed exemplary materials that may be used for the PR element 170, the PR element 170 may be comprised of thulium monosulfide (TmS), or thulium selenide (TmSe).

Figure 33:
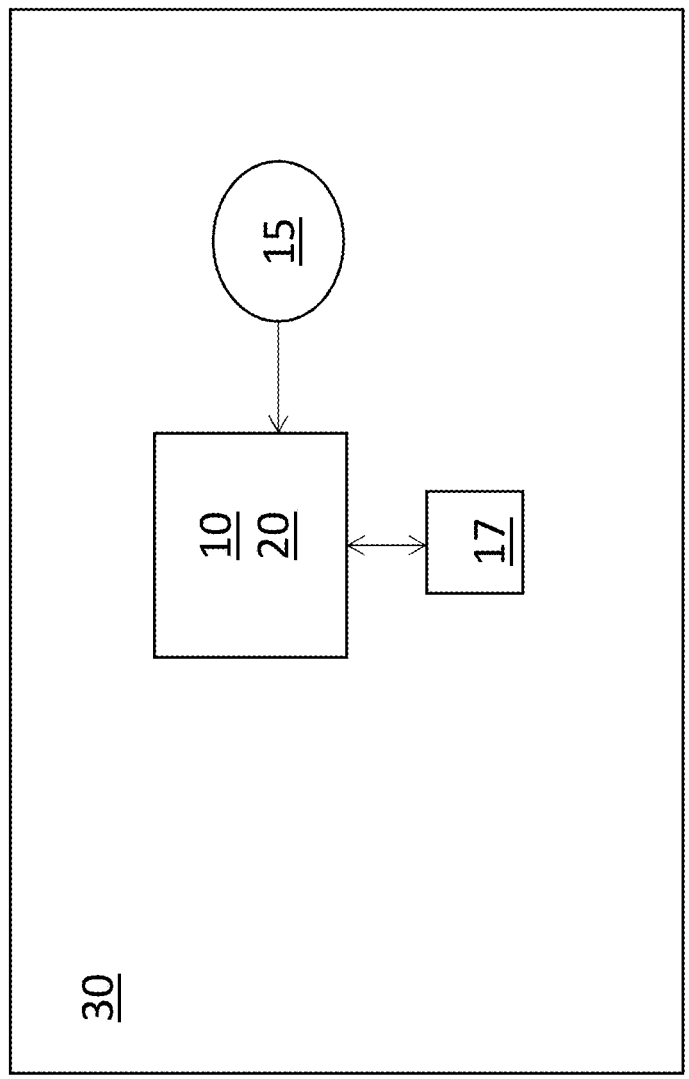
FIG. 33 is a block diagram of aspects of a semiconductor device including a PET device according to embodiments of the invention

FIG. 33 is a block diagram of aspects of a semiconductor device 30 including a PET device 10, 20 according to embodiments of the invention. A voltage source 15 is used to apply a voltage across the M0 metal layer 120 and the M1 metal layer 130 to modulate the PE element 125. This modulation results in switching the PR element 170 between a low and high resistive state. When the PET device 10, 20 is used as a switch element, read and write components 17 may be coupled to the PET device 10, 20. The PET device 10, 20 may be used as a memory in another context as part of semiconductor device 30, as well.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a piezoelectronic transistor (PET) device, the method comprising:
   forming a first stack of dielectric layers;
   forming a first metal layer over the first stack;
   forming a piezoelectric (PE) material on the first metal layer;
   forming a second metal layer on the PE material; and
   forming a piezoresistive (PR) element on the second metal layer through a gap in a first membrane spaced a distance, d, above the second metal layer, wherein d is greater than zero.

2. The method according to claim 1, further comprising forming the first membrane the distance d above the second metal layer as a cantilever with the gap therebetween based on a reactive ion etching (RIE) process.

3. The method according to claim 1, wherein the forming the PR element includes forming a layer comprising the PR element and a passivation layer.

4. The method according to claim 3, further comprising depositing a clamp layer over the passivation layer.

5. The method according to claim 4, wherein the forming the layer includes disposing the PR element and one of a titanium nitride (TiN) cap, a platinum (Pt)/TiN/Pt layer, a titanium aluminum nitride (TiAlN) and TiN layer, Pt/TiN layer, or palladium (Pd)/TiN layer as the passivation layer, and the clamp layer includes aluminum (Al).

6. The method according to claim 3, further comprising hermetically sealing the PET device based on the forming the layer through the gap.

7. The method according to claim 1, further comprising opening a window in a second membrane, formed above the first membrane, to expose the gap in the first membrane and facilitate the forming the PR element through the gap.

8. The method according to claim 7, further comprising forming the gap in the first membrane and opening the window in the second membrane based on reactive ion etching of silicon nitride (SiN) or atomic layer deposition (ALD) films comprising the first membrane and the second membrane.

9. The method according to claim 1, further comprising etching the first metal layer, the PE material, and the second metal layer to create a plurality of second stacks over the first stack prior to the depositing the PR element, each of the plurality of second stacks including the first metal layer, the PE material, and the second metal layer.

10. The method according to claim 9, wherein the forming the PR element through the gap includes depositing the PR element on the second metal layer of one of the plurality of second stacks.

11. The method according to claim 9, further comprising forming a bridge between the second metal layer of two of the plurality of second stacks.

12. The method according to claim 11, wherein the forming the bridge includes depositing titanium (Ti) between the second metal layer of two of the plurality of second stacks.

\* \* \* \* \*